US010872904B2

(12) United States Patent
Lee

(10) Patent No.: US 10,872,904 B2
(45) **Date of Patent: *Dec. 22, 2020**

(54) SEMICONDUCTOR DEVICE AND METHOD OF MANUFACTURING THE SAME

(71) Applicant: SK hynix Inc., Icheon-si (KR)

(72) Inventor: Nam Jae Lee, Cheongju-si (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 16/737,837

(22) Filed: Jan. 8, 2020

(65) Prior Publication Data

US 2020/0144292 A1 May 7, 2020

Related U.S. Application Data

(60) Continuation of application No. 16/155,264, filed on Oct. 9, 2018, now Pat. No. 10,566,347, which is a (Continued)

(30) Foreign Application Priority Data

Jul. 31, 2015 (KR) ........................ 10-2015-0108611

(51) Int. Cl.
*H01L 27/11582* (2017.01)
*H01L 27/11556* (2017.01)
(Continued)

(52) U.S. Cl.
CPC .. *H01L 27/11582* (2013.01); *H01L 21/76816* (2013.01); *H01L 21/76879* (2013.01);
(Continued)

(58) Field of Classification Search
CPC ......... H01L 27/11556; H01L 27/11582; H01L 27/11553; H01L 27/1158; H01L 27/11551;
(Continued)

(56) References Cited

U.S. PATENT DOCUMENTS 8,581,323 B2 11/2013 Uenaka et al.
8,822,285 B2 9/2014 Hwang et al.
(Continued)

FOREIGN PATENT DOCUMENTS

KR 1020130142195 A 12/2013
KR 1020170014757 A 2/2017

OTHER PUBLICATIONS

Elliott Cho, Examiner Initiated Telephonic Interview, "PA2739-0_ Response.docx", Aug. 22, 2017, 5 Pages.

*Primary Examiner* — Jose R Diaz
(74) *Attorney, Agent, or Firm* — William Park & Associates Ltd.

(57) ABSTRACT

Provided herein is a semiconductor device including N stacked groups (where N is a natural number greater than or equal to two) sequentially stacked over a substrate, each stacked group including interlayer insulating films and conductive patterns alternately stacked, and N concave portions each having stepped sidewalls formed in the interlayer insulating films and the conductive patterns of the stacked groups, the N concave portions each having stepped sidewalls being aligned in a first direction.

10 Claims, 36 Drawing Sheets

Related U.S. Application Data continuation of application No. 15/674,860, filed on Aug. 11, 2017, now Pat. No. 10,128,268, which is a division of application No. 14/987,908, filed on Jan. 5, 2016, now Pat. No. 9,773,804.

(51) Int. Cl.

| | |
|---|---|
| ***H01L 23/528*** | (2006.01) |
| ***H01L 23/522*** | (2006.01) |
| ***H01L 21/768*** | (2006.01) |
| ***H01L 27/11524*** | (2017.01) |
| ***H01L 27/11548*** | (2017.01) |
| ***H01L 27/1157*** | (2017.01) |
| ***H01L 27/11575*** | (2017.01) |

(52) U.S. Cl.

CPC ........ *H01L 23/528* (2013.01); *H01L 23/5226* (2013.01); *H01L 27/1157* (2013.01); *H01L 27/11524* (2013.01); *H01L 27/11548* (2013.01); *H01L 27/11556* (2013.01); *H01L 27/11575* (2013.01)

(58) Field of Classification Search

CPC ......... H01L 27/11514; H01L 27/11578; H01L 23/528; H01L 23/5283

See application file for complete search history.

(56) References Cited

U.S. PATENT DOCUMENTS

| | | | | |
|---|---|---|---|---|
| 8,890,229 | B2 * | 11/2014 | Watanabe | H01L 29/7926 257/314 |
| 9,773,804 | B2 * | 9/2017 | Lee | H01L 23/528 |
| 9,929,093 | B2 * | 3/2018 | Lee | H01L 23/5226 |
| 10,128,268 | B2 | 11/2018 | Lee | |
| 2011/0169071 | A1 | 7/2011 | Uenaka et al. | |
| 2011/0180866 | A1 | 7/2011 | Matsuda et al. | |
| 2012/0295409 | A1 | 11/2012 | Yun et al. | |
| 2013/0059432 | A1 | 3/2013 | Lee et al. | |
| 2013/0153983 | A1 | 6/2013 | Jeon | |
| 2013/0161821 | A1 | 6/2013 | Hwang et al. | |
| 2014/0048945 | A1 * | 2/2014 | Lim | H01L 27/11582 257/773 |
| 2014/0167129 | A1 | 6/2014 | Kim | |
| 2015/0287739 | A1 | 10/2015 | Lee | |

* cited by examiner

SEMICONDUCTOR DEVICE AND METHOD OF MANUFACTURING THE SAME

CROSS-REFERENCE TO RELATED APPLICATION

The present application is a continuation application for U.S. patent application Ser. No. 16/155,264, filed on Oct. 9, 2018, which is a continuation application of Ser. No. 15/674,860, filed on Aug. 11, 2017, which is a divisional application of Ser. No. 14/987,908, filed on Jan. 5, 2016, and claims priority to Korean patent application number 10-2015-0108611 filed on Jul. 31, 2015, in the Korean Intellectual Property Office, the entire disclosure of which is herein incorporated by reference in its entirety.

BACKGROUND

1. Technical Field

Various embodiments of the present disclosure generally relate to a semiconductor device and a method of manufacturing the same, and more particularly to a semiconductor device including a multilayer structure and a method of manufacturing the same.

2. Description of Related Art

Examples of semiconductor devices include a memory device that is able to store data. A memory device may have a string structure in which memory cells are coupled in series.

In order to highly integrate the memory device having the string structure, a three-dimensional (3D) memory device has been proposed. The memory cells of a 3D memory device are three-dimensionally arranged on a substrate. For instance, the 3D memory device may have a multilayer structure that includes conductive patterns formed at different heights and coupled to the memory cells. In order to independently transmit electrical signals to the conductive patterns formed at different heights, contact plugs have to be coupled to the conductive patterns, respectively. To this end, a variety of techniques are being developed.

SUMMARY

Various embodiments of the present disclosure are directed to a semiconductor device, which includes a multilayer structure having areas to which contact plugs may be coupled, and a method of manufacturing the same.

An embodiment of the present disclosure provides a semiconductor device, comprising N stacked groups (where N is a natural number greater than or equal to two) sequentially stacked over a substrate, each stacked group including interlayer insulating films and conductive patterns alternately stacked, and N concave portions each having stepped sidewalls formed in the interlayer insulating films and the conductive patterns of the stacked groups, N concave portions each having stepped sidewalls being aligned in a first direction.

An embodiment of the present disclosure provides a method of manufacturing a semiconductor device, comprising: sequentially stacking, on a substrate, N stacked groups (where N is a natural number of 2 or more) including first and second material films, which are alternately stacked, etching an uppermost $N^{th}$ stacked group among the stacked groups to form N first-type stepped structures, which are aligned in a first direction, in the $N^{th}$ stacked group, forming a hole-type mask pattern including openings for exposing the first-type stepped structures on the stacked groups, and performing an etching process using the hole-type mask pattern as an etching barrier to form second-type stepped structures including multiple steps having height differences in the first direction and a second direction perpendicular to the first direction.

BRIEF DESCRIPTION OF THE DRAWINGS

The above and other features and advantages of the present disclosure will become more apparent to those of ordinary skill in the art by describing in detail embodiments thereof with reference to the attached drawings in which.

DETAILED DESCRIPTION

Figure 1:
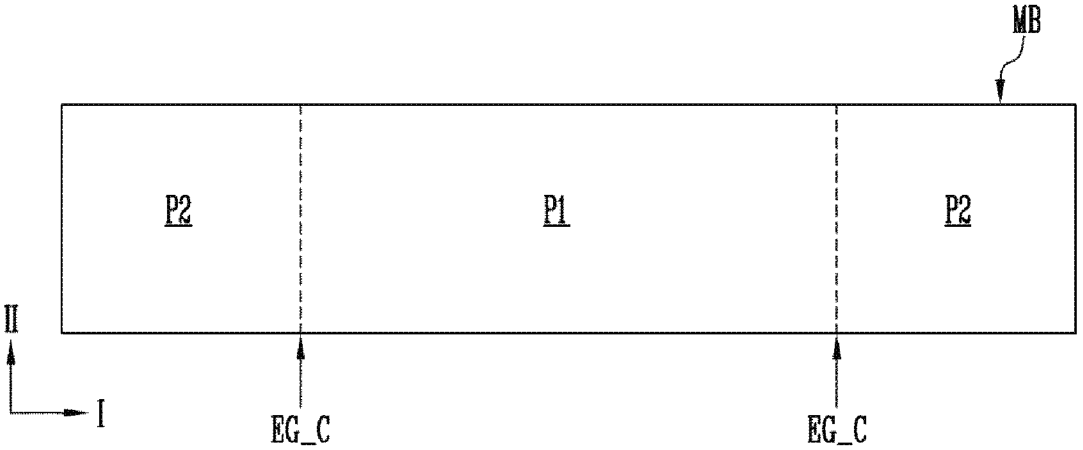
FIG. 1 illustrates contact areas and a memory array area of a semiconductor device according to an embodiment of the present invention.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the example embodiments to those skilled in the art.

Advantages and features of the present invention, and methods for achieving the same will be cleared with reference to example embodiments described later in detail together with the accompanying drawings. Accordingly, the present invention is not limited to the following embodiments but embodied in other types. Rather, these embodiments are provided so that this disclosure will be thorough, and convey the technical idea of the present disclosure to those skilled in the art.

In the drawing figures, dimensions may be exaggerated for clarity of illustration. It will be understood that when an element is referred to as being "between" two elements, it can be the only element between the two elements, or one or more intervening elements may also be present. Like reference numerals refer to like elements throughout. In addition, if certain parts are described as being coupled to other parts, they are not only directly coupled to the other parts, but also indirectly coupled to the other parts with any other device intervened therebetween. In addition, when an element is referred to as "comprising" or "including" a component, it does not preclude another component but may further include the other component unless the context clearly indicates otherwise.

FIG. 1 illustrates contact areas and a memory array area of a semiconductor device according to embodiments of the present invention.

In FIG. 1, the semiconductor device according to an embodiment of the present invention includes a memory block MB. The memory block MB may include a memory array area P1 and contact areas P2.

A plurality of memory strings is disposed in the memory array area P1. Conductive patterns, which are coupled to the memory strings, extend to the contact areas P2 from the memory array area P1 along a first direction I. Also, pass transistors may be placed under the conductive patterns disposed in the contact areas P2.

The contact areas P2 may be disposed at both sides of the memory array area P1. The memory array area P1 and the contact areas P2 may be aligned in the first direction I. The contact areas P2 have cell side edges EG_C at which the contact areas P2 are in contact with the memory array area P1. In the following drawings, the cell side edges EG_C are represented to show the sides of the contact areas P2 at which the contact areas P2 are in contact with the memory array area P1, and an additional description therefor is omitted.

The memory blocks MB may be spaced apart from each other in a second direction II perpendicular to the first direction I.

Figure 2A:
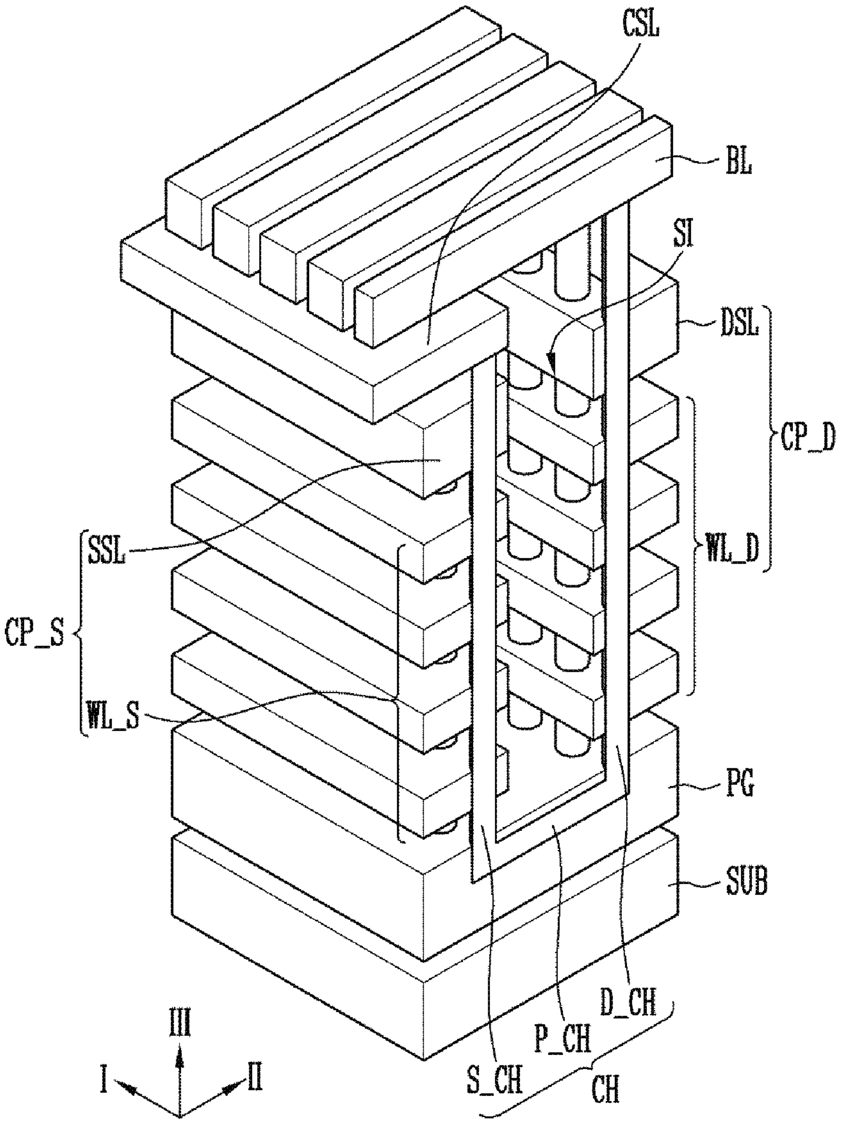
FIGS. 2A and 2B are perspective views illustrating a memory string structure of a semiconductor device according to embodiments of the present invention.
Figure 2B:
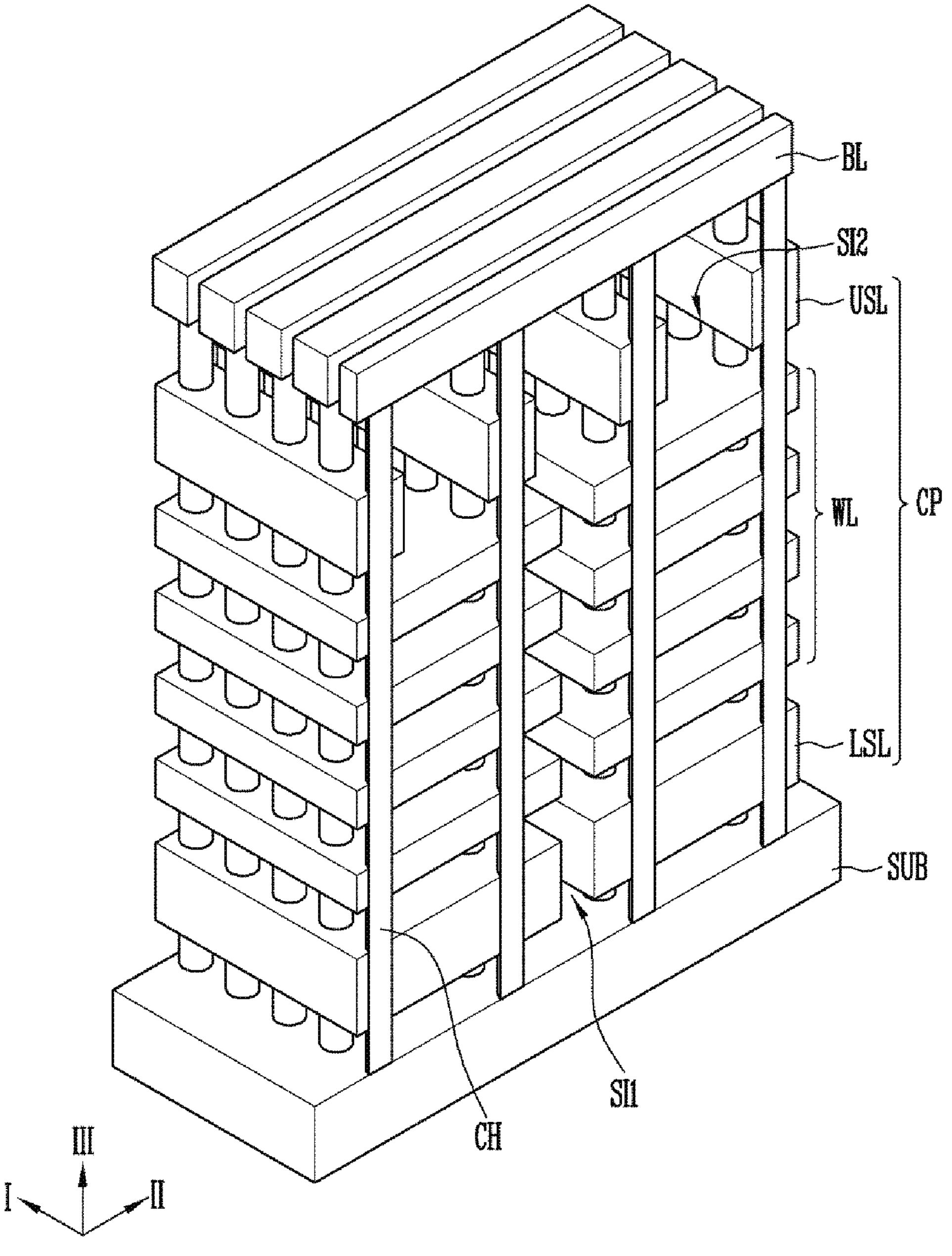

FIGS. 2A and 2B are perspective views illustrating a memory string structure of the semiconductor device according to embodiments of the present invention. For the sake of description, insulating films are not depicted in FIGS. 2A and 2B.

FIG. 2A illustrates a 3D memory string formed by arranging memory cells along a U-shaped channel film CH.

In FIG. 2A, the memory string may include the U-shaped channel film CH. The channel film CH includes a pipe channel film P_CH, a source side channel film S_CH, and a drain side channel film D_CH. The source side channel film S_CH and the drain side channel film D_CH may extend in a third direction III perpendicular to the first and the second direction I and II from the pipe channel film P_CH. The channel films CH may be arranged in a matrix shape along the first and the second direction I and II.

The pipe channel film P_CH is enclosed with a pipe gate PG disposed over a substrate SUB.

The source side channel film S_CH is enclosed with source side conductive patterns CP_S stacked at predetermined intervals along the third direction III. The top of the source side channel film S_CH is coupled to a common source line CSL. The source side conductive patterns CP_S are disposed between the common source line CSL and the pipe gate PG. The source side conductive patterns CP_S include source side word lines WL_S and a source select line SSL. The source side word lines WL_S are stacked at predetermined intervals in the third direction III. The source select line SSL is disposed between the source side word lines WL_S and the common source line CSL. One or more source select lines SSL may be stacked between the source side word lines WL_S and the common source line CSL.

The drain side channel film D_CH is enclosed with drain side conductive patterns CP_D stacked at predetermined intervals in the third direction III. The top of the drain side channel film D_CH is coupled to a bit line BL. The drain side conductive patterns CP_D are disposed between the bit line BL and the pipe gate PG. The drain side conductive patterns CP_D include drain side word lines WL_D and a drain select line DSL. The drain side word lines WL_D are stacked at predetermined intervals in the third direction III. The drain select line DSL is disposed between the drain side word lines WL_D and the bit line BL. One or more drain select lines DSL may be stacked between the drain side word lines WL_D and the bit line BL.

The source side conductive patterns CP_S and the drain side conductive patterns CP_D may be separated by a slit SI disposed between the source side channel film S_CH and the drain side channel film D_CH. The source side conductive patterns CP_S and the drain side conductive patterns CP_D may be formed at the same height. The source side conductive patterns CP_S and the drain side conductive patterns CP_D may extend in the first direction I.

The bit line BL and the common source line CSL may be separately disposed in different layers. For example, the bit line BL is disposed above the common source line CSL, and the common source line CSL may be disposed between the bit line BL and the source side conductive patterns CP_S.

Although not shown in the drawings, the outer wall of the channel film CH is enclosed with a multilayer memory film including a tunnel insulating film, a data storage film, and a blocking insulating film. The multilayer memory film is disposed between each of the source side conductive patterns CP_S, the drain side conductive patterns CP_D, and the pipe gate PG and the channel film CH.

As described above, a pipe transistor is formed at an intersection of the pipe gate PG and the pipe channel film P_CH. Also, drain side memory cells are formed at intersections of the drain side word lines WL_D and the drain side channel film D_CH. Source side memory cells are formed at intersections of the source side word lines WL_S and the source side channel film S_CH. A source select transistor is formed at an intersection of the source select line SSL and the source side channel film S_CH. A drain select transistor is formed at an intersection of the drain select line DSL and the drain side channel film D_CH. The drain select transistor, the drain side memory cells, the pipe transistor, the source side memory cells, and the source select transistor, which are coupled in series along the channel film CH, may constitute a U-shaped memory string. The U-shaped memory string coupled between the bit line BL and the common source line CSL may form a 3D memory device.

FIG. 2B illustrates the 3D memory string comprising the memory cells arranged along straight-type channel films CH.

In FIG. 2B, the memory string may include the straight-type channel films CH. The channel films CH are coupled to the substrate SUB including a source area and extend in the third direction III. The channel films CH may be coupled between the substrate SUB and the bit line BL. The channel films CH may be coupled to the source area of the substrate SUB. The channel films CH may be arranged in a matrix shape along the first and the second direction I and II.

The channel films CH are enclosed with conductive patterns CP stacked at predetermined intervals along the third direction III. The conductive patterns CP are disposed between the substrate SUB and the bit line BL. The conductive patterns CP may include a lower select line LSL, word lines WL formed over the lower select line LSL, and an upper select line USL formed over the word lines WL. The conductive patterns CP may be separated by a first slit SI1. The upper select line USL may have a width smaller than the word lines WL and the lower select line LSL, and may be separated by a second slit SI2. One or more lower select lines LSL may be disposed between the word lines WL and the substrate SUB. One or more upper select lines USL may be disposed between the bit line BL and the word lines WL. The conductive patterns CP may extend in the first direction I.

Although not shown, the outer wall of the channel film CH is enclosed with a multilayer memory film comprising a tunnel insulating film, a data storage film and a blocking insulating film. The multilayer memory film is disposed between each of the conductive patterns CP and the channel film.

As described above, a lower select transistor is formed at an intersection of the lower select line LSL and the channel film CH. The memory cells are formed at intersections of the word lines WL and the channel film CH. The upper select transistor is formed at an intersection of the upper select line USL and the channel film CH. The lower select transistor, the memory cells, and the upper select transistor, which are coupled in series along the channel film CH, may constitute a straight-type memory string. The memory string coupled between the bit line BL and the source line SL may form a 3D memory device.

As illustrated in FIGS. 2A and 2B, the 3D memory strings and the channel films CH are arranged in a matrix shape along the first and the second direction I and II, and may be disposed in the memory array area (e.g., P1 of FIG. 1) of the memory block (e.g., MB of FIG. 1).

Figure 3:
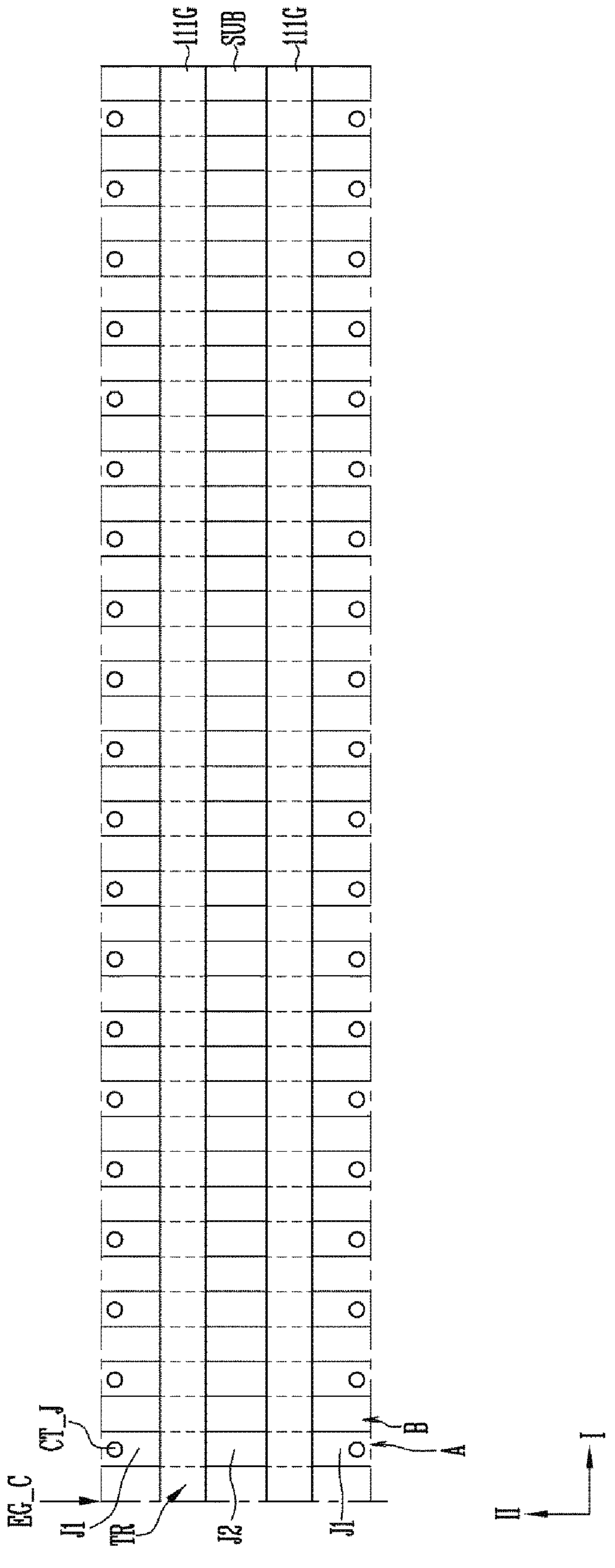
FIG. 3 is a plan view illustrating a pass transistor according to an embodiment of the present invention.

FIG. 3 is a plan view illustrating the pass transistor according to an embodiment of the present invention. FIG. 3 shows the configuration placed under the contact areas (e.g., P2 of FIG. 1) of the memory block (e.g., MB of FIG. 1).

In FIG. 3, pass transistors TR are disposed under the contact areas (e.g., P2 of FIG. 1) of the memory block (e.g., MB of FIG. 1). The pass transistors TR may apply operating voltages to the conductive patterns (e.g., CP_S, CP_D of FIG. 2A or CP of FIG. 2B) in response to the block select signals. The pass transistors TR may be aligned in the direction of extension of the block select gate line 111G.

The block select gate line 111G may extend along the direction to which the conductive patterns (e.g., CP_S, CP_D of FIG. 2A or CP of FIG. 2B) extend (e.g., the first direction I). The block select gate line 111G is coupled in common to the gates of the pass transistors TR aligned in the first direction I. The block select gate line 111G is formed over the substrate SUB with the gate insulating film (not shown) interposed therebetween. Two or more block select gate lines 111G may be arranged side by side at a predetermined interval along the second direction II. The substrate SUB is exposed to both sides of the block select gate line 111G.

A portion of the substrate SUB placed under the contact areas (e.g., P2 of FIG. 1) of the memory block (e.g., MB of FIG. 1) may include active areas A and isolation areas B. The active areas A and the isolation areas B may be alternately disposed in the first direction I. The active areas A and the isolation areas B extend in the second direction II. The isolation areas B include an isolation insulating film that is formed in the substrate SUB. For example, the isolation areas B may be formed by filling recesses, which are formed on the substrate SUB during a fabrication process of the semiconductor device, with insulation materials. The active areas A are separated by the isolation areas B. The active areas A may include first and second junction regions J1 and J2 doped with impurities. The first and second junction regions J1 and J2 are formed in the active areas A exposed to both sides of the block select gate line 111G. The second junction region J2 may be disposed between two adjacent block select gate lines 111G in the second direction II. The first junction region J1 may be disposed in two lines with the two block select gate lines 111G interposed therebetween. The first junction region J1 may be coupled with first junction contact plugs CT_J. A plurality of first junction contact plugs CT_J, corresponding to the pass transistors TR aligned in the first direction I, may be aligned in the first direction I.

Although not shown, a second junction contact plug may be coupled to the second junction region J2, and the second junction contact plug may be coupled to a global line to which operating voltages are applied.

The first and second junction regions J1 and J2 may be used as the source and the drain of each of the pass transistors TR. The pass transistors TR, which are composed of the block select gate line 111G and the first and second junction regions J1 and J2, may be coupled to routing wires disposed over the pass transistors.

The memory block may be superimposed over the block select gate line 111G. The memory block may include a plurality of memory strings. The memory strings may be configured as shown in FIGS. 2A and 2B. The conductive patterns of the memory block coupled to the memory string may be coupled to the pass transistors TR via the first junction contact plugs CT_J and the routing wires. In embodiments of the present invention, in order to connect the conductive patterns and the pass transistors TR, concave portions having stepped sidewalls are formed in the conductive patterns. The concave portions are described in detail according to embodiments of the present invention with reference to the following drawings.

Figure 4A:
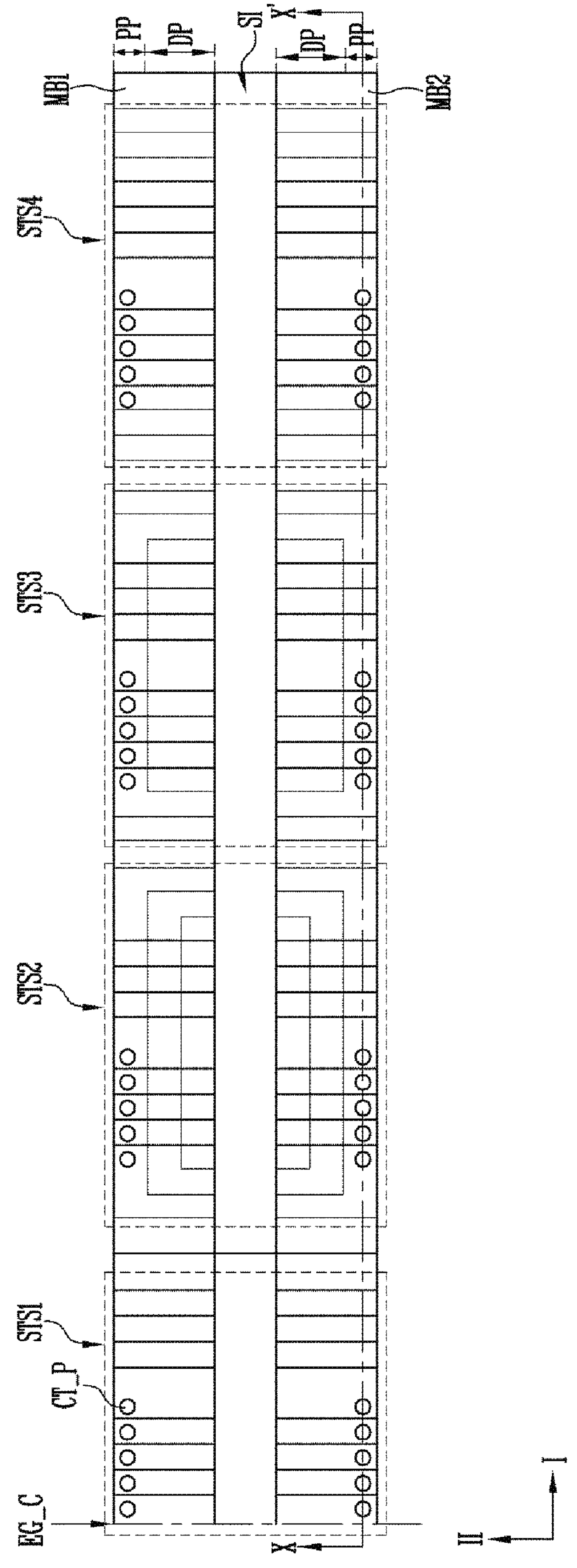
FIGS. 4A and 4B are a plan view and a perspective view illustrating concave portions, which have stepped sidewalls, according to an embodiment of the present invention.
Figure 4B:
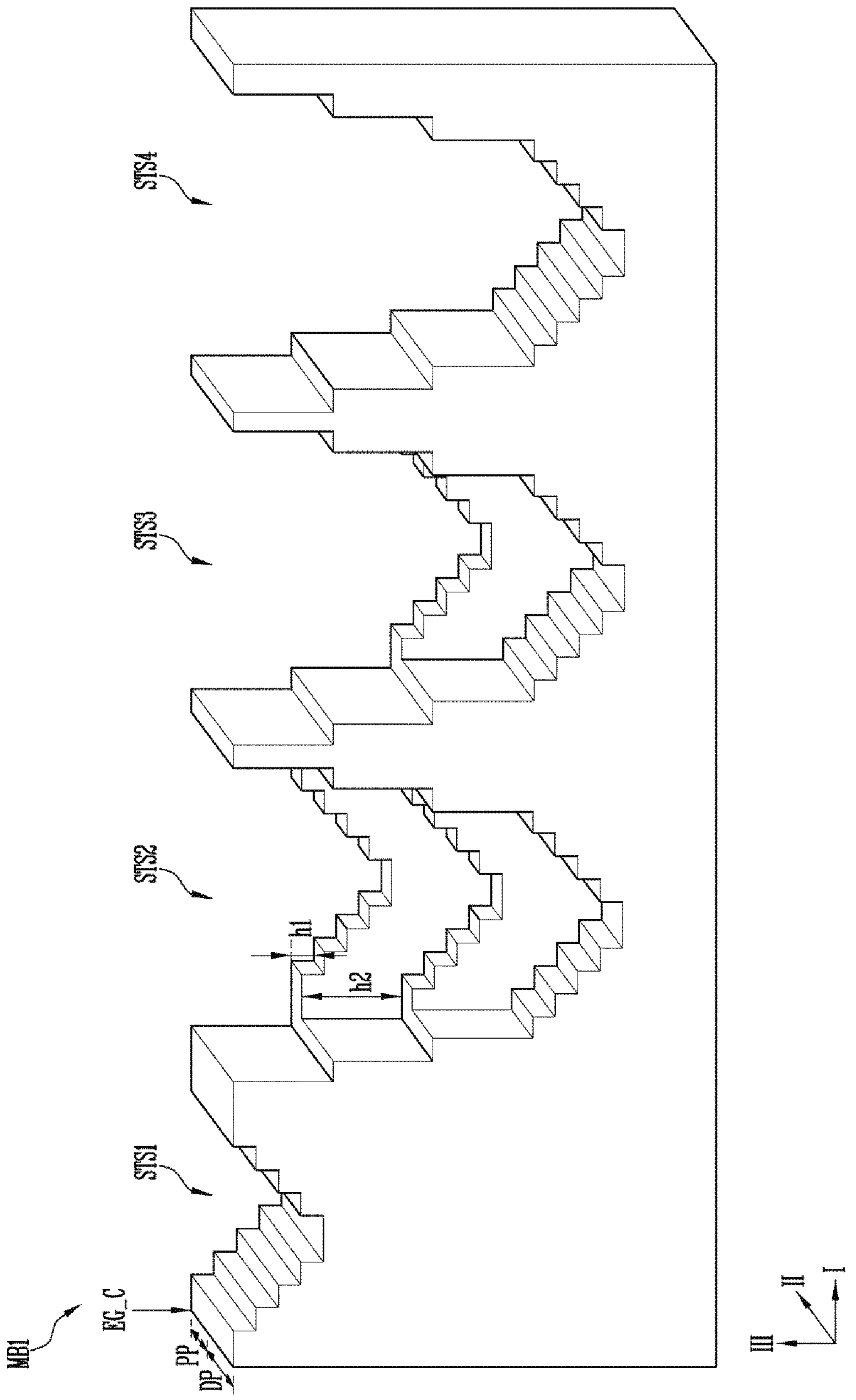

FIGS. 4A and 4B are a plan view and a perspective view illustrating the concave portions according to an embodiment of the present invention. FIG. 4A is a plan view illustrating a pair of first and second memory blocks MB1 and MB2, which are positioned adjacent to each other with the slit SI interposed therebetween. FIG. 4B is a perspective view illustrating the concave portions formed in the first memory block MB1. FIGS. 4A and 4B show the contact areas of the first and second memory blocks MB1 and MB2.

With reference to FIGS. 4A and 4B, the first and second memory blocks MB1 and MB2 are separated by the slit SI extending in the first direction I. The pair of first and second memory blocks MB1 and MB2 separated by the slit SI may include concave portions STS1 to STS4 having stepped sidewalls.

The concave portions STS1 to STS4 may be superimposed over the pass transistors of FIG. 3. The number of concave portions STS1 to STS4 may be set to N so as to be equal to the number of layers of stacked groups, N (where N is a natural number greater than or equal to two). The stacked groups are included in the first and second memory blocks MB1 and MB2, and the slit SI may be placed between the first and second memory blocks MB1 and MB2. A detailed description of the stacked groups is described later with reference to FIG. 5.

The concave portions STS1 to STS4 each have a stepped structure having multiple steps. The concave portions STS1 to STS4 are aligned in the first direction I. The stepped structures of the concave portions STS1 to STS4, which are aligned in the first direction, may be provided in different forms. The concave portions STS1 to STS4 are formed symmetrically with respect to the slit SI.

The first concave portion STS1 adjacent to the memory array area may include a stepped structure having multiple steps extending evenly in the second direction II. The $N^{th}$ concave portion (e.g. fourth concave portion STS4), which is the farthest concave portion from the memory array area, may include a stepped structure having multiple steps extending evenly in the second direction II. As will be described in FIG. 13D, the fourth concave portion STS4 (i.e. $N^{th}$ concave portion) may include multiple steps having a height difference in the second direction II.

Between the first concave portion STS1 and the fourth concave portion STS4 (i.e. $N^{th}$ concave portion), the second concave portion STS2 and the third concave portion STS3 (i.e. $(N-1)^{th}$ concave portion) each may include multiple steps having a height difference in the second direction II.

The concave portions STS1 to STS4 each include multiple steps having a height difference in the first direction I. According to embodiments of the present invention, the second concave portion STS2 and the third concave portion STS3 (i.e. $(N-1)^{th}$ concave portion) each include multiple steps having height differences in the first direction I and the second direction II. As such, the stepped structure of each of the second concave portion STS2 and the third concave portion STS3 (i.e. $(N-1)^{th}$ concave portion) may include multiple steps having a first height difference h1 in the first direction I, and multiple steps having a second height difference h2 greater than the first height difference h1 in the second direction II.

As will be described later in FIG. 13D, the fourth concave portion STS4 (i.e. $N^{th}$ concave portion) may include multiple steps having height differences in the first direction I and the second direction II. As such, the multiple steps of the fourth concave portion STS4 (i.e. $N^{th}$ concave portion) may be formed in a first height difference h1 in the first direction I and may be formed in a second height difference h2 greater than the first height difference h1 in the second direction II.

The concave portions STS1 to STS4 each may be formed symmetrically with respect to an axis parallel to the second direction II. The contact area of each of the first and second memory blocks MB1 and MB2 includes a pad portion PP and a dummy portion DP. The pad portion PP is disposed in a direction parallel to the slit SI. The dummy portion DP is disposed between the slit SI and the pad portion PP.

Also, contact plugs CT_P may be disposed over the multiple steps of the concave portions STS1 to STS4 in the pad portion PP. The contact plugs CT_P may be aligned in the first direction I. The depths of the concave portions STS1 to STS4, which are disposed in the pad portion PP, increase as a distance between the concave portions STS1 to STS4 and the memory array area increases. In other words, the concave portions STS1 to STS4 may be formed at different depths in the pad portion PP. The contact plugs CT_P may be disposed at different depths on the multiple steps of the concave portions STS1 to STS4 that are disposed at different depths in the pad portion PP.

Figure 5:
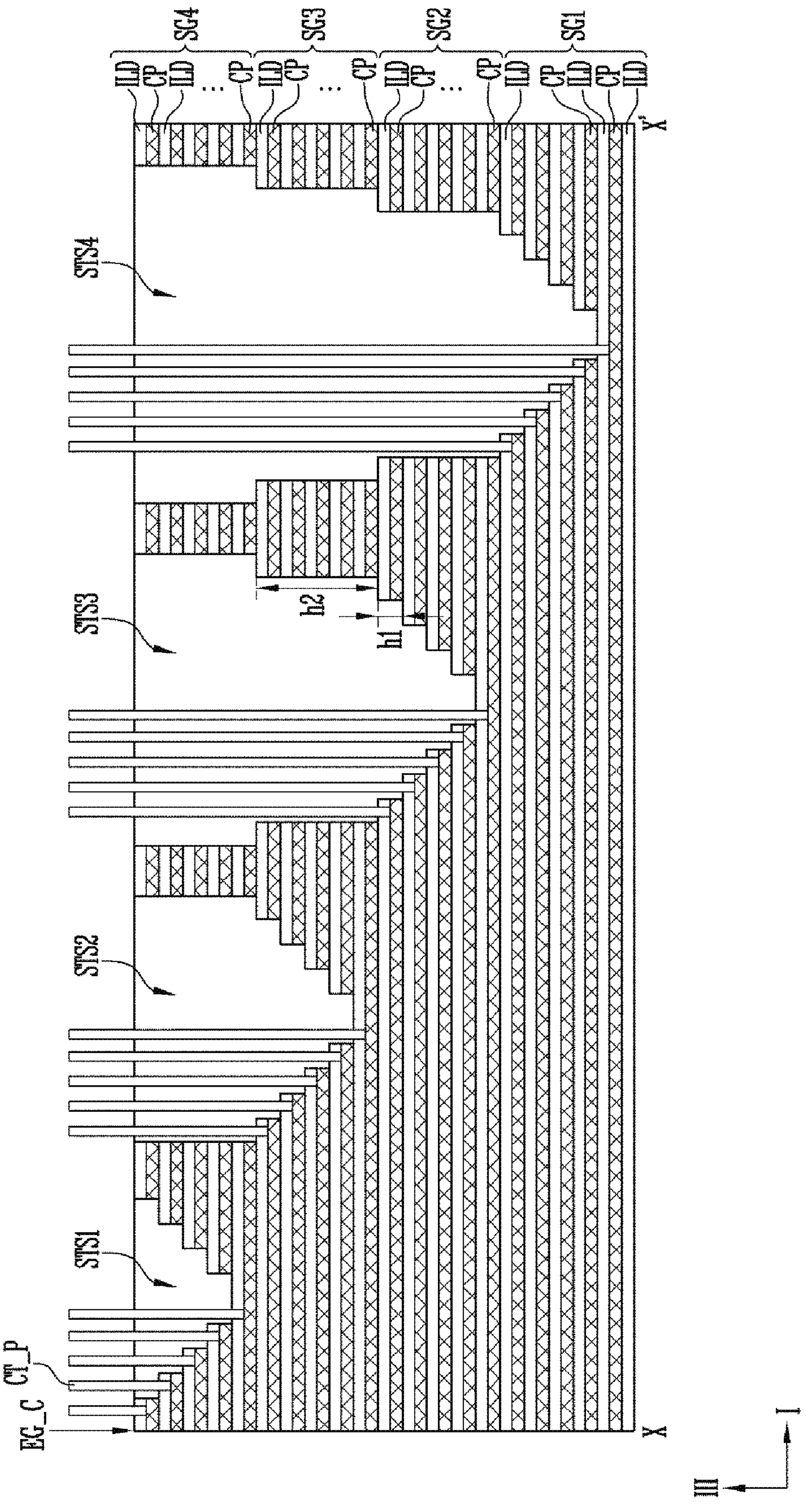
FIG. 5 is a cross-sectional view taken along the line "X-X'" of FIG. 4A.

FIG. 5 is a cross-sectional view taken along the line "X-X'" of FIG. 4A.

Referring to FIG. 5, N concave portions are disposed within N stacked groups that are sequentially formed. The N stacked groups may be formed over the substrate including the pass transistors (TR of FIG. 3). The N stacked groups include the memory array area and the contact area. The contact area of the N stacked groups may include the pad portion and the dummy portion. The pad portion and the dummy portion may be disposed as shown in FIGS. 4A and 4B. FIG. 5 is a cross-sectional view illustrating the pad portion of the contact area.

The N concave portions may include first to $N^{th}$ concave portions (e.g. STS1 to STS4) sequentially aligned in the first direction I. The first concave portion STS1 is defined as the closest to the memory array area (e.g., P1 of FIG. 1). As the numeral of first to $N^{th}$ concave portions (e.g. STS1 to STS4) increases, the distance thereof from the memory array area increases. The N stacked groups may include the first to $N^{th}$ stacked groups (e.g. SG1 to SG4) sequentially formed over the substrate. The first stacked group SG1 is defined as the closest to the substrate. As the numeral of first to $N^{th}$ stacked groups (e.g. SG1 to SG4) increases, the distance thereof from the substrate increases.

The first to $N^{th}$ stacked groups (e.g. SG1 to SG4) each include interlayer insulating films ILD and conductive patterns CP, which are alternately stacked. The first to $N^{th}$ concave portions (e.g. STS1 to STS4) each have a stepped structure including multiple steps. Here, the steps of the stepped structure may include parts of the conductive patterns CP disposed at different heights.

The contact plugs CT_P, which are formed at different depths, are coupled to the conductive patterns CP that constitute the stepped structure of each of the first to $N^{th}$ concave portions (e.g. STS1 to STS4). The contact plugs CT_P may extend in the third direction III so as to protrude from the stacked groups SG1 to SG4. The first to $N^{th}$ concave portions (e.g. STS1 to STS4) each may be filled with a planarization insulating film 151. The contact plugs CT_P may pass through any one of the interlayer insulating films ILD on the conductive patterns CP and through the planarization insulating film 151.

The first to $N^{th}$ concave portions (e.g. STS1 to STS4) may extend to the insides of the first to $N^{th}$ stacked groups (e.g. SG1 to SG4), respectively, so as to expose the conductive patterns CP of the first to $N^{th}$ stacked groups (e.g. SG1 to SG4) through the steps thereof. More particularly, the depths of the first to $N^{th}$ concave portions (e.g. STS1 to STS4), which are disposed in the pad portion, increase as a distance between the first to $N^{th}$ concave portions and the memory array area increases, and thus the first to $N^{th}$ concave portions extend to the insides of the first to $N^{th}$ stacked groups (e.g. SG1 to SG4), respectively. The number of steps of the first concave portion formed in the $N^{th}$ stacked group SG4 may be the same as the number of steps disposed at lower portions of the second to $N^{th}$ concave portions STS2 to STS4 extending to the insides of the first to $(N-1)^{th}$ stacked groups SG1 to SG3.

Among the first to $N^{th}$ concave portions (e.g. STS1 to STS4), the first concave portion STS1 adjacent to the memory array area may include a stepped structure having multiple steps, which includes the conductive patterns CP of the uppermost $N^{th}$ stacked group (e.g. SG4) among the first to $N^{th}$ stacked groups (e.g. SG1 to SG4).

Each of the second to $N^{th}$ concave portions (e.g. STS2 to STS4) may include a stepped structure having multiple steps, each of which has a height corresponding to the first height difference h1. The stepped structure having multiple steps, each of which has a height corresponding to the first height difference h1, may define a first sidewall formed in the first direction I and comprise x steps. Each of the x steps may have one pair of an interlayer insulating film and a conductive pattern, among the interlayer insulating films ILD and the conductive patterns CP. The stepped structure having multiple steps, each of which has a height corresponding to the first height difference h1, includes conductive patterns CP for the lowermost stacked group (e.g., any one of SG1 to SG3) exposed by the second to $N^{th}$ concave portions (e.g. STS2 to STS4).

Each of the second to $N^{th}$ concave portions (e.g. STS2 to STS4) may include a stepped structure defined by the second height difference h2 greater than the first height difference h1. The stepped structure having the second height difference h2 is defined by the upper stacked group (e.g., any one of SG2 to SG4) disposed over the lowermost stacked group (e.g., any one of SG1 to SG3) exposed by the second to $N^{th}$ concave portions (e.g. STS2 to STS4). The stepped structure having multiple steps, each of which has a height corresponding to the second height difference h2, may define a second sidewall formed in the second direction II as shown in FIG. 4B. The second height difference may be equal to a total thickness of one to x+1 pairs, each including an interlayer insulating film and a conductive pattern, among the interlayer insulating films ILD and the conductive patterns CP.

Figure 6A:
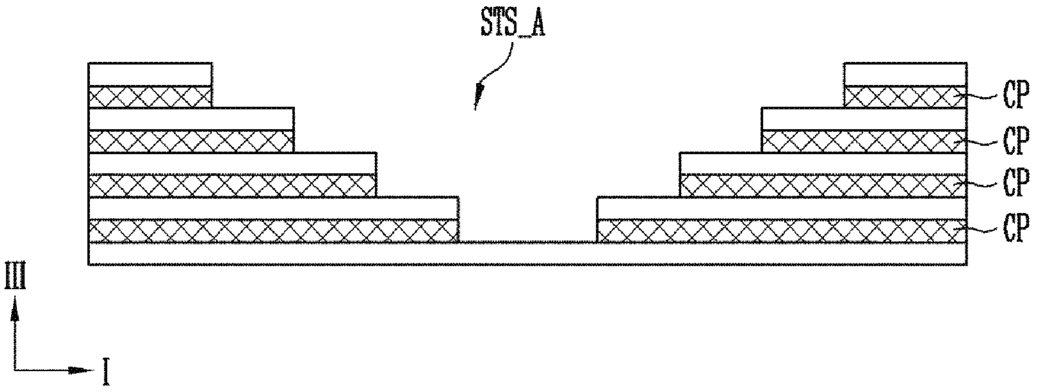
FIGS. 6A and 6B are cross-sectional views illustrating various structures of the concave portions according to embodiments of the present invention.
Figure 6B:
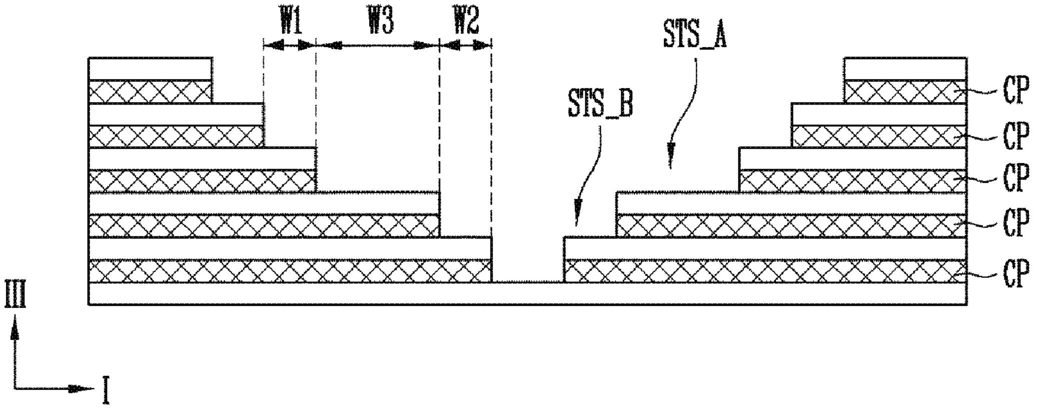

FIGS. 6A and 6B are cross-sectional views illustrating various structures of the concave portions according to embodiments of the present invention.

As illustrated in FIG. 6A, the concave portion may include an A-type stepped structure STS_A having multiple steps, the width of which is uniform.

As illustrated in FIG. 6B, the concave portion may include an A-type stepped structure STS_A and a B-type stepped structure STS_B. The B-type stepped structure STS_B may be formed by extending from where the A-type stepped structure STS_A is placed toward the lower portion where the substrate is disposed. The A-type stepped structure STS_A may include multiple steps each step having the first width W1, and the B-type stepped structure STS_B may include multiple steps each step having the second width W2. The A-type stepped structure STS_A and the B-type stepped structure STS_B may be spaced apart by an interval corresponding to the third width W3. The first to third widths W1 to W3 may be the same as or different from each other.

Figure 7:
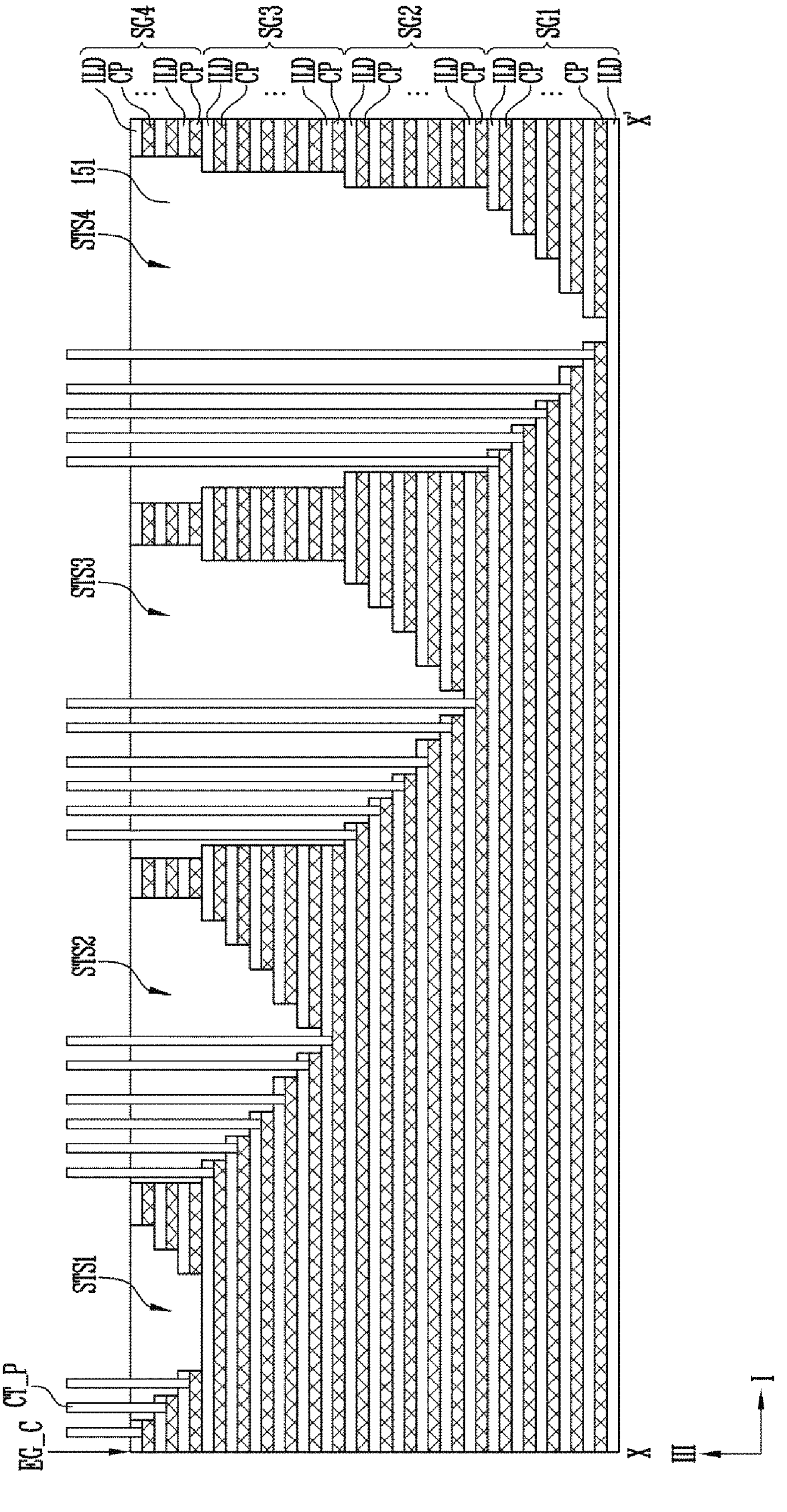
FIG. 7 is a cross-sectional view illustrating concave portions according to an embodiment of the present invention.

FIG. 7 is a cross-sectional view illustrating the concave portions according to an embodiment of the present invention. FIG. 7 illustrates a modification of the embodiment as shown in FIGS. 4A, 4B and 5. FIG. 7 is a cross-sectional view illustrating the pad portion of the N stacked groups.

In FIG. 7, the N concave portions are disposed in the sequentially-formed N stacked groups as described in FIGS. 4A, 4B and 5. The N concave portions include the first to $N^{th}$ concave portions (e.g. STS1 to STS4), which are sequentially aligned in the first direction I and have stepped sidewalls. The N stacked groups include the first to $N^{th}$ stacked groups (e.g. SG1 to SG4), which are sequentially formed over the substrate.

Each of the first to $N^{th}$ stacked groups (e.g. SG1 to SG4) includes interlayer insulating films ILD and conductive patterns CP, which are alternately stacked. Each of the first to $N^{th}$ concave portions (e.g. STS1 to STS4) has a stepped structure including multiple steps. The steps of the stepped structure of each of the first to $N^{th}$ concave portions (e.g. STS1 to STS4) may be parts of the conductive patterns CP disposed at different heights.

The contact plugs CT_P, which are formed at different depths, are coupled to the conductive patterns CP for the stepped structure of each of the first to $N^{th}$ concave portions (e.g. STS1 to STS4). The contact plugs CT_P may extend in the third direction III to protrude from the stacked groups SG1 to SG4. Each of the first to $N^{th}$ concave portions (e.g. STS1 to STS4) may be filled with a planarization insulating film 151. The contact plugs CT_P may pass through any one of the interlayer insulating films ILD on the conductive patterns CP and through the planarization insulating film 151.

The number of layers of the conductive patterns CP of the $N^{th}$ stacked group SG4 is different from the number of layers of the conductive patterns CP of each of the first to $(N-1)^{th}$ stacked groups SG1 to SG3. In an embodiment, the number of layers of the conductive patterns CP of each of the first to $(N-1)^{th}$ stacked groups SG1 to SG3 is greater than the number of layers of the conductive patterns CP of the $N^{th}$ stacked group SG4. The conductive patterns CP of the $N^{th}$ stacked group SG4 may be used as the source select line or the drain select line as shown in FIG. 2A, or may be used as the upper select line as shown in FIG. 2B.

The number of steps of the stepped structure of the first to $N^{th}$ concave portions STS1 to STS4, which extend to the insides of the first to $N^{th}$ stacked groups SG1 to SG4, may vary depending on the number of layers of the conductive patterns CP of each of the first to $N^{th}$ stacked groups SG1 to SG4. According to embodiments of the present invention, the first to $(N-1)^{th}$ stacked groups SG1 to SG3 include a large number of conductive patterns CP compared to the $N^{th}$ stacked group SG4. Therefore, the lower stepped structures of the second to $N^{th}$ concave portions STS2 to STS4, which extend to the insides of the first to $(N-1)^{th}$ stacked groups SG1 to SG3, may include large numbers of steps compared to the first concave portion STS1 defined in the $N^{th}$ stacked group SG4.

With reference to the following drawings, methods of manufacturing the semiconductor device according to embodiments of the present invention are described. The following drawings illustrate the configuration formed over the substrate including the pass transistors as shown in FIG. 3, mainly based on the contact areas. To show the sides adjacent to the memory array area, the cell side edges EG_C are represented.

FIGS. 8A to 12B illustrate the process of forming the memory block of a semiconductor device according to an embodiment of the present invention.

Figure 8A:
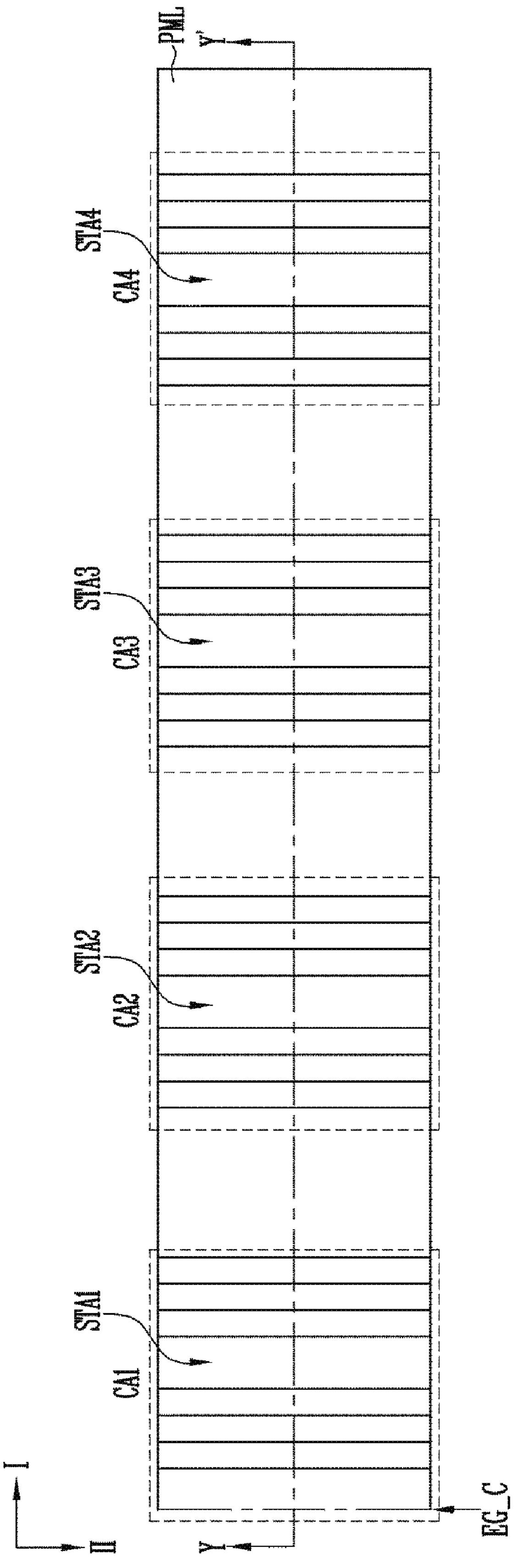
FIGS. 8A to 12B illustrate a process of forming a memory block of a semiconductor device according to an embodiment of the present invention.
Figure 8B:
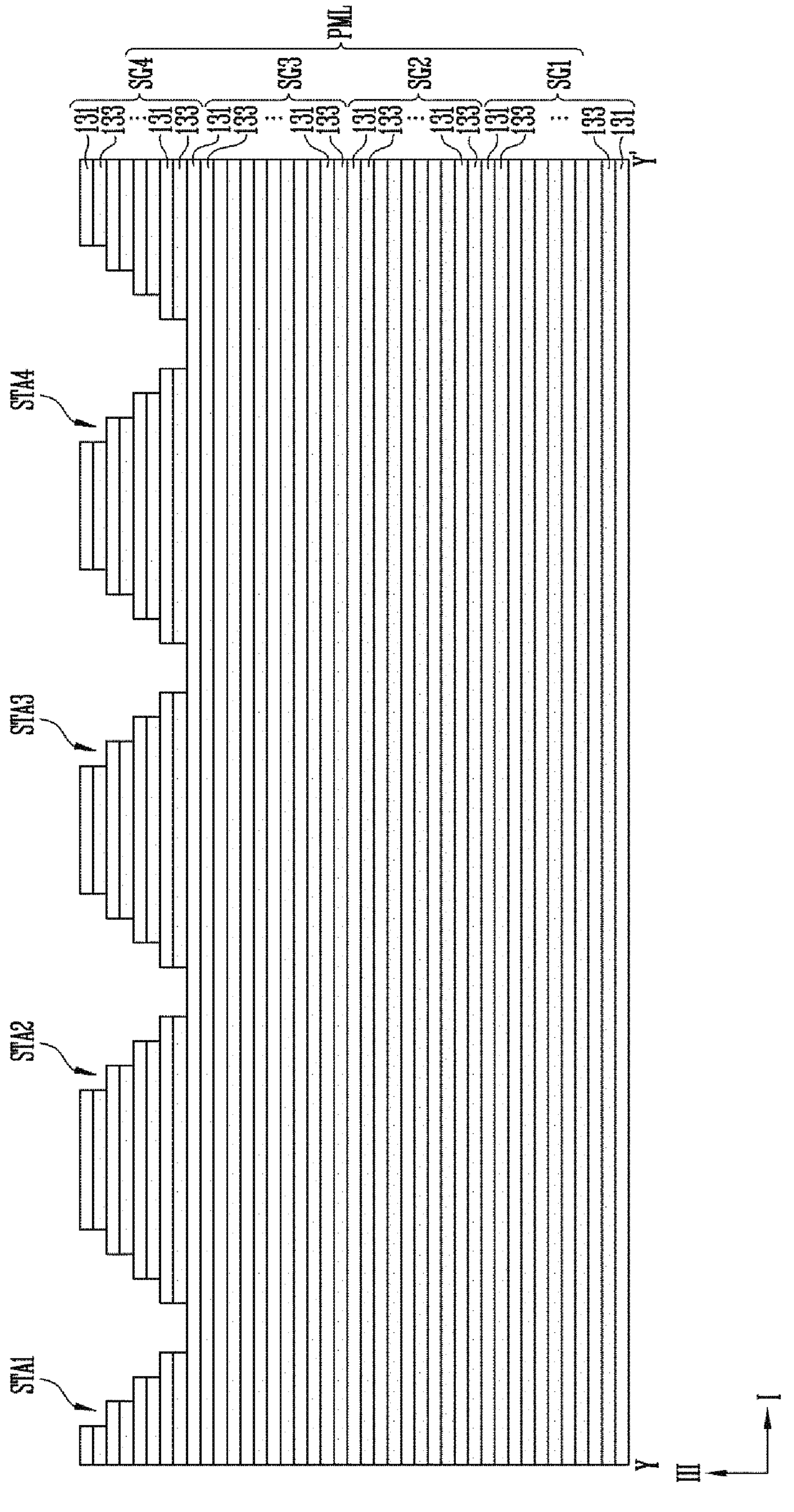

FIGS. 8A and 8B illustrate the process of forming stacked groups and first-type stepped structures. FIG. 8A is a plan view illustrating the layout of the configuration formed over the contact area, and FIG. 8B is a cross-sectional view taken along the line "Y-Y'" of FIG. 8A.

In FIGS. 8A and 8B, a preliminary structure PML including the sequentially formed N stacked groups (e.g. SG1 to SG4) is provided on a substrate (not shown). The N stacked groups may include the first to $N^{th}$ stacked groups (e.g. SG1 to SG4), which are sequentially formed. The first stacked group SG1 is defined as the closest to the substrate. As the numeral of first to $N^{th}$ stacked groups (e.g. SG1 to SG4) increases, the distance between the stacked group and the substrate increases. The first to $N^{th}$ stacked groups (e.g. SG1 to SG4) may be formed over the entire area of the substrate.

The preliminary structure PML may include the first to $N^{th}$ areas (e.g. CA1 to CA4). The first to $N^{th}$ areas (e.g. CA1 to CA4) correspond to the areas where the concave portions will be disposed in the subsequent processes.

Each of the first to $N^{th}$ stacked groups (e.g. SG1 to SG4) includes first material films 131 and second material films 133, which are alternately stacked. The second material films 133 correspond to the areas where the conductive patterns are disposed, and the first material films 131 correspond to the areas where the interlayer insulating films are disposed. The first to $N^{th}$ stacked groups (e.g. SG1 to SG4) may include the first and second material films 131 and 133, the numbers of layers of which are the same as each other.

The second material films 133 are formed of a material different from the first material films 131. For example, the first material films 131 may be formed of an insulating material for an interlayer insulating film, and the second material films 133 may be formed of a conductive material for a conductive pattern.

Alternatively, the first material films 131 may be formed of an insulating material for an interlayer insulating film, and the second material films 133 may be formed of a sacrificial insulating material serving as a sacrificial film and having an etching selectivity for the first material films 131. As such, the first material films 131 may be formed of silicon oxide, and the second material films 133 may be formed of silicon nitride. When all of the first and second material films 131 and 133 are formed of an insulating material, an etching process for forming channel holes or slits may be relatively easily performed.

Alternatively, the first material films 131 may be formed of a sacrificial insulating material serving as a sacrificial film and having an etching selectivity for the second material films 133, and the second material films 133 may be formed of a conductive material for a conductive pattern. As such, the first material films 151 may be formed of undoped polysilicon, and the second material films 153 may be formed of doped polysilicon. When all of the first and second material films 131, 133 are formed of a conductive material, an etching process for forming channel holes or slits may be relatively easily performed.

Thereafter, the uppermost $N^{th}$ stacked group (e.g. SG4) among the first to $N^{th}$ stacked groups (e.g. SG1 to SG4) is etched and thus N first-type stepped structures (e.g. STA1 to STA4), which are aligned in the first direction I, are formed over the contact area of the substrate. The N first-type stepped structures may include first to $N^{th}$ stepped structures (e.g. STA1 to STA4), which are sequentially arranged in the first direction I. The first stepped structure STA1 is defined as a stepped structure that is closest to the memory array area (P1 of FIG. 1). As the numeral of first to $N^{th}$ stepped structures (e.g. STA1 to STA4) increases, the distance between the stepped structure and the memory array area increases. The first to $N^{th}$ stepped structures (e.g. STA1 to STA4) are formed over the first to $N^{th}$ areas (e.g. CA1 to CA4).

Each of the first to $N^{th}$ stepped structures (e.g. STA1 to STA4) includes multiple steps having a first height difference in the first direction I. The first to $N^{th}$ stepped structures (e.g. STA1 to STA4) may be symmetrically formed with respect to the axis in the second direction II.

The first to $N^{th}$ stepped structures (e.g. STA1 to STA4) may be formed through the following procedures.

A first mask pattern (not shown) for exposing the center of each of the first to $N^{th}$ areas (e.g. CA1 to CA4) is formed over the preliminary structure PML. Thereafter, an etching process is performed using the first mask pattern as an etching barrier, whereby the $N^{th}$ stacked group (e.g. SG4) is etched. When etching is performed using the first mask pattern as an etching barrier, a first etching set, which includes a pair of first and second material films disposed at the uppermost positions among the plurality of first and second material films 131 and 133, is etched. Thereafter, the size of the first mask pattern is decreased through etching. Consequently, the size of the area exposed by the first mask pattern is increased. In this manner, a portion of the remaining area of the first etching set, and the pair of first and second material films disposed adjacent to the first etching set under the first etching set are exposed as a second etching set. Subsequently, the exposed portions of the first and second etching sets are etched using the first mask pattern, which has decreased in size, as an etching barrier. Decreasing the size of the first mask pattern and etching the first and second material films 131 and 133 of the $N^{th}$ stacked group (e.g. SG4) are repeated, thus forming the first to $N^{th}$ stepped structures (e.g. STA1 to STA4). After the formation of the first to $N^{th}$ stepped structures (e.g. STA1 to STA4), the first mask pattern may be removed.

Figure 9A:
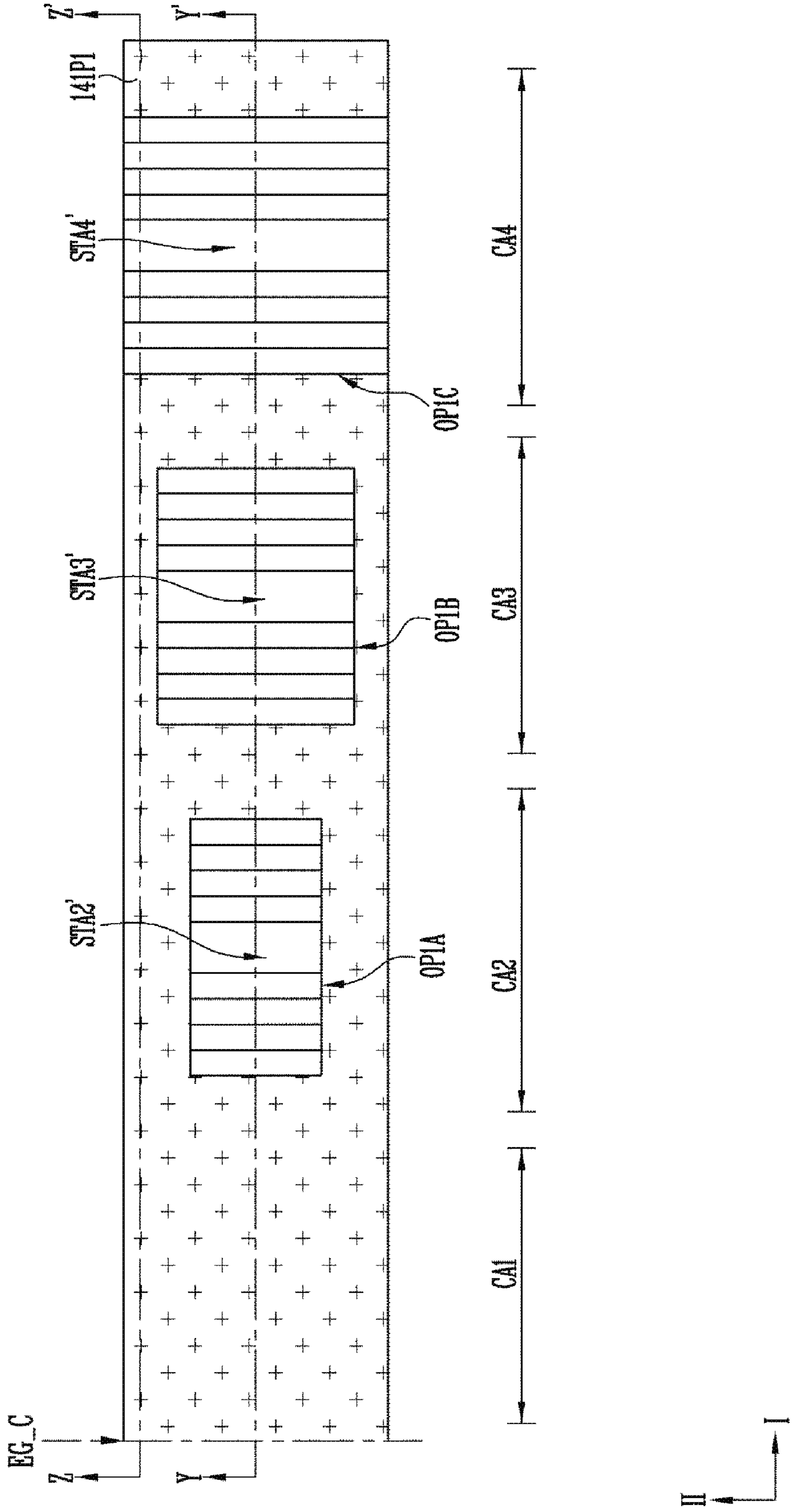
Figure 9B:
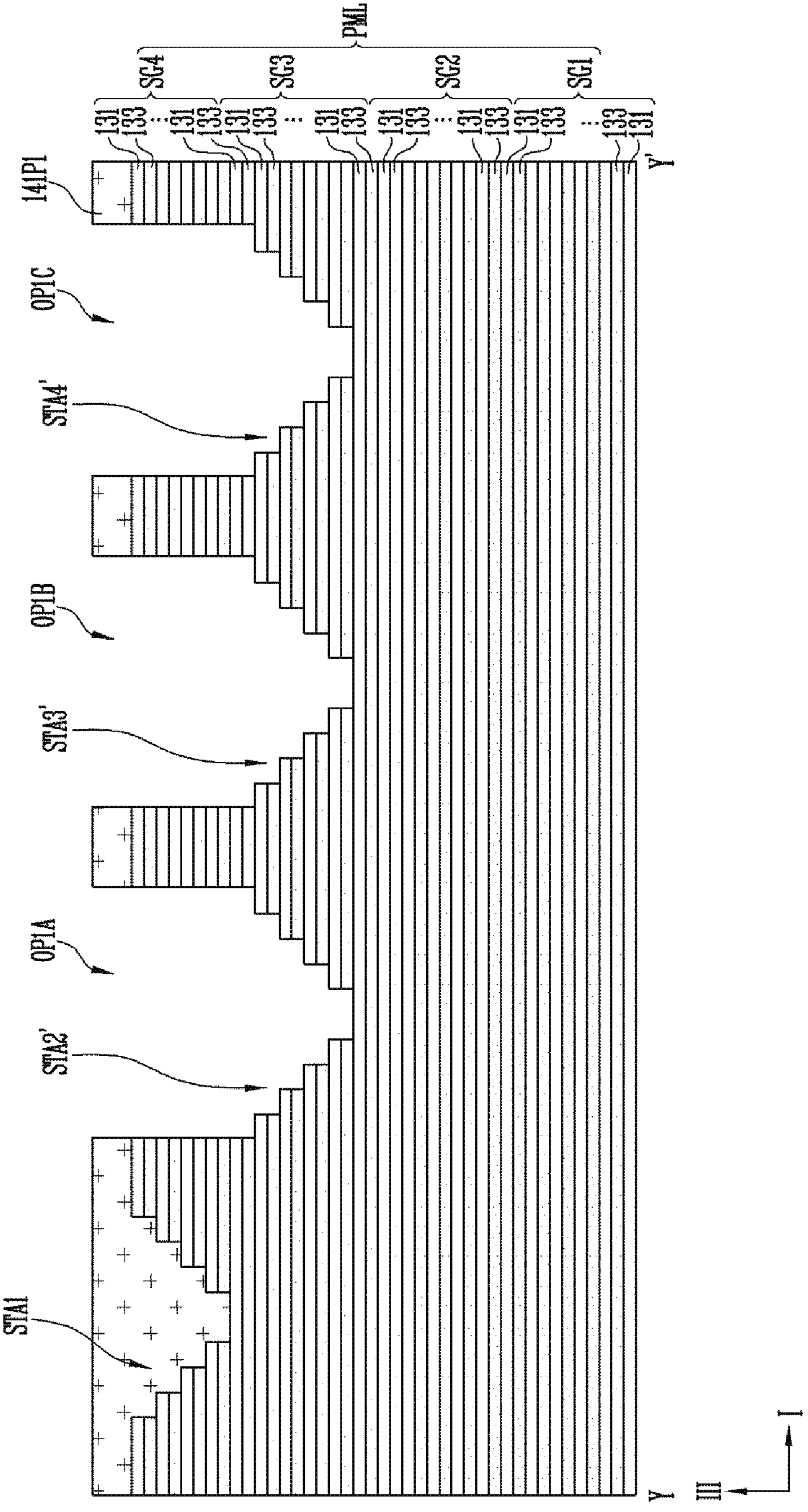
Figure 9C:
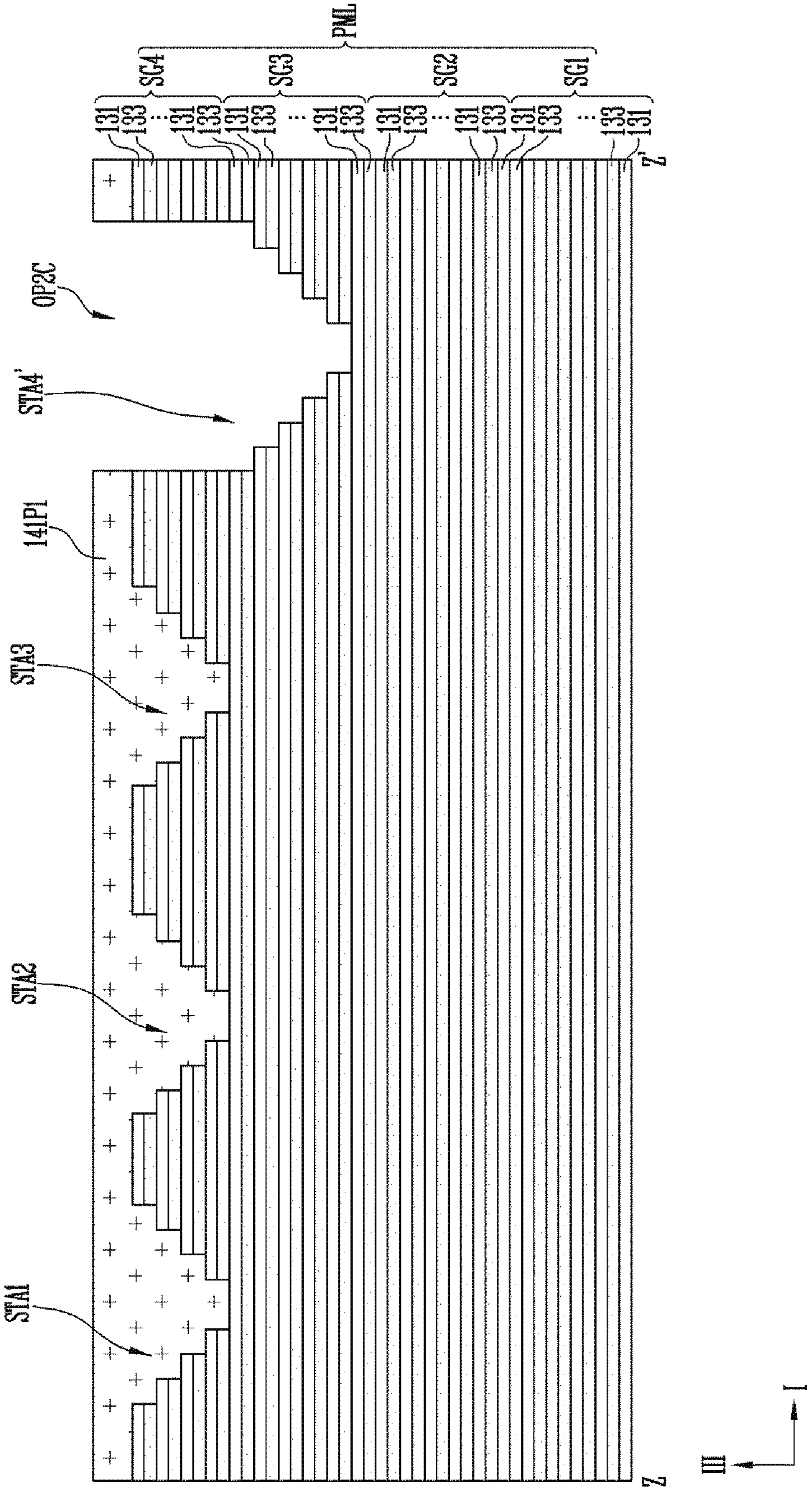
Figure 10A:
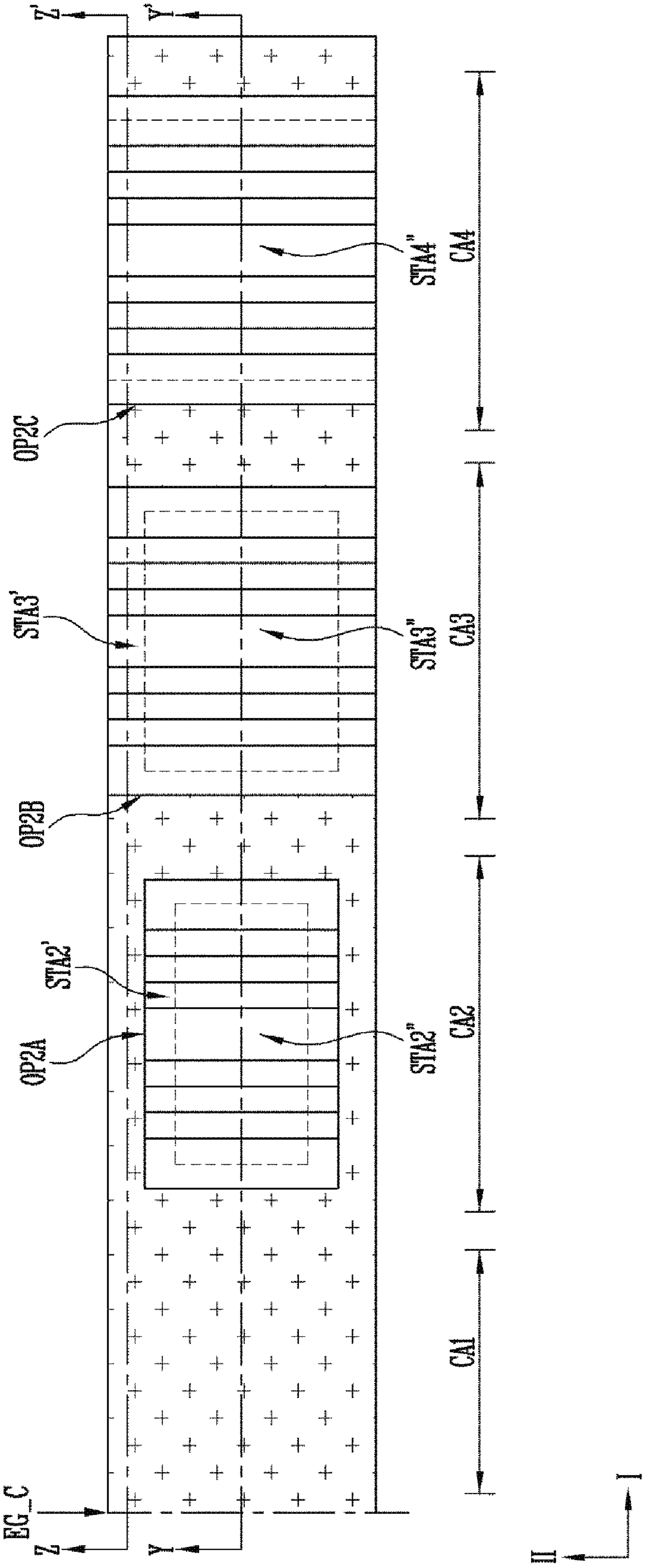
Figure 10B:
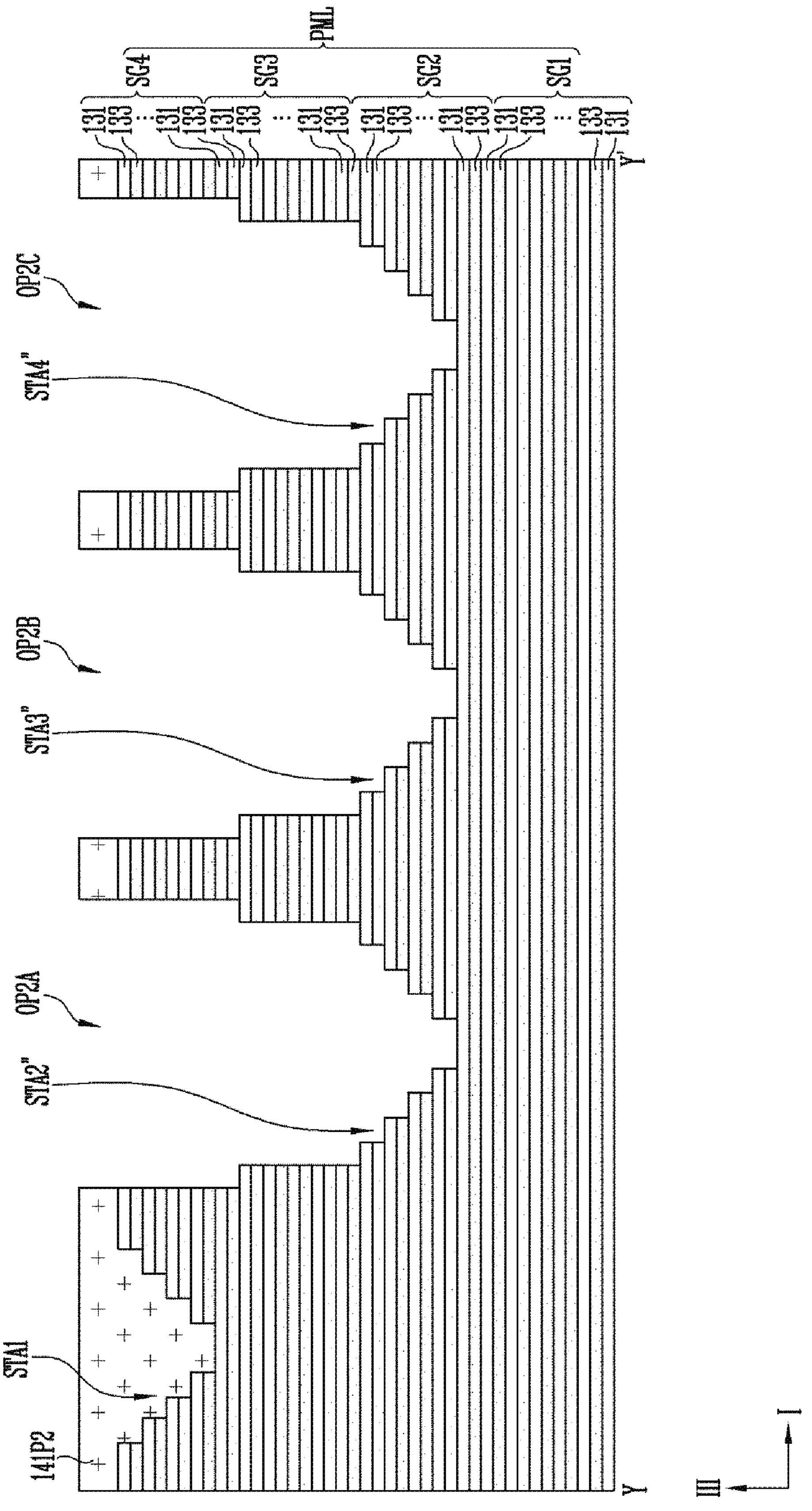
Figure 10C:
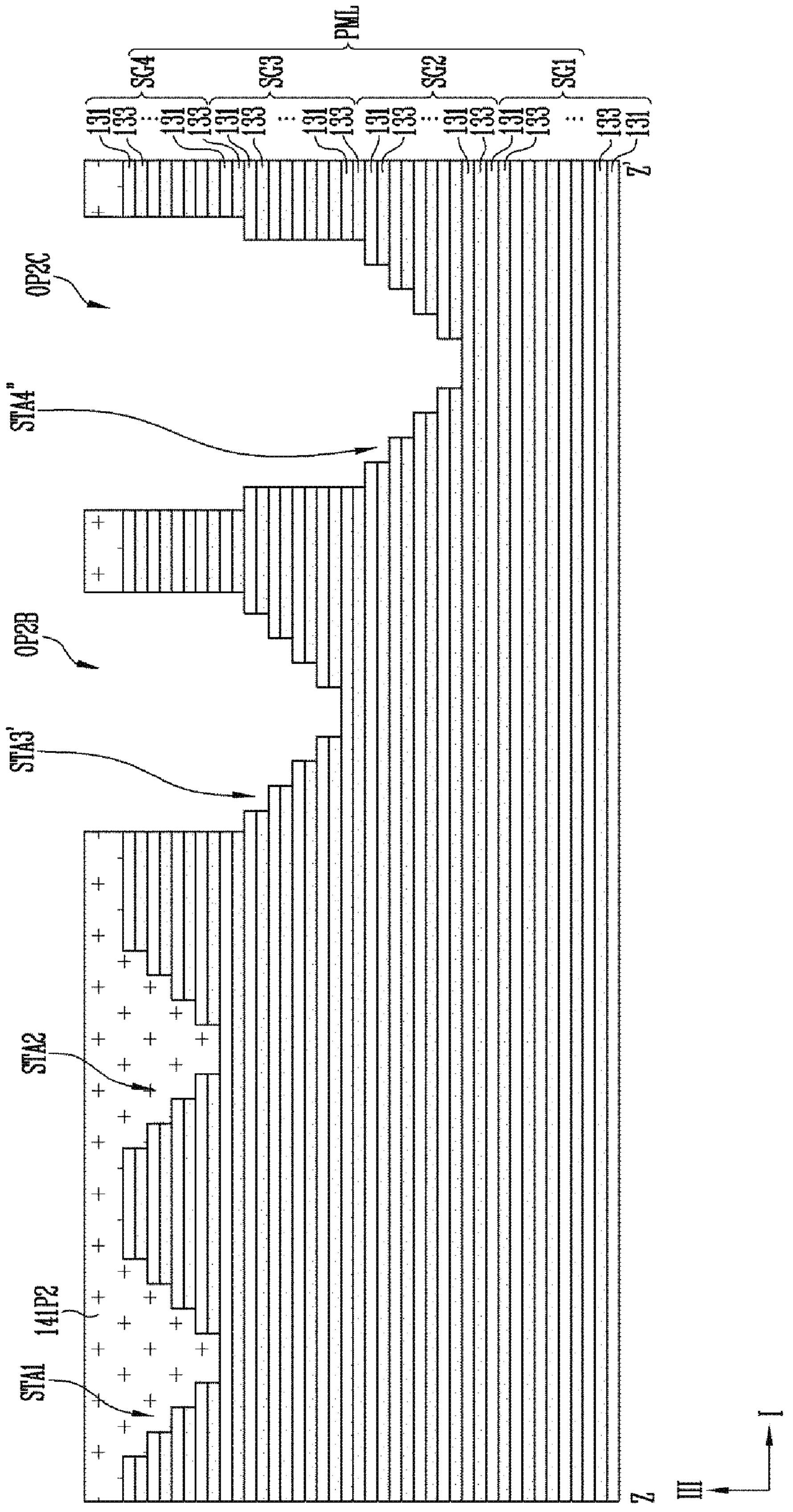
Figure 11A:
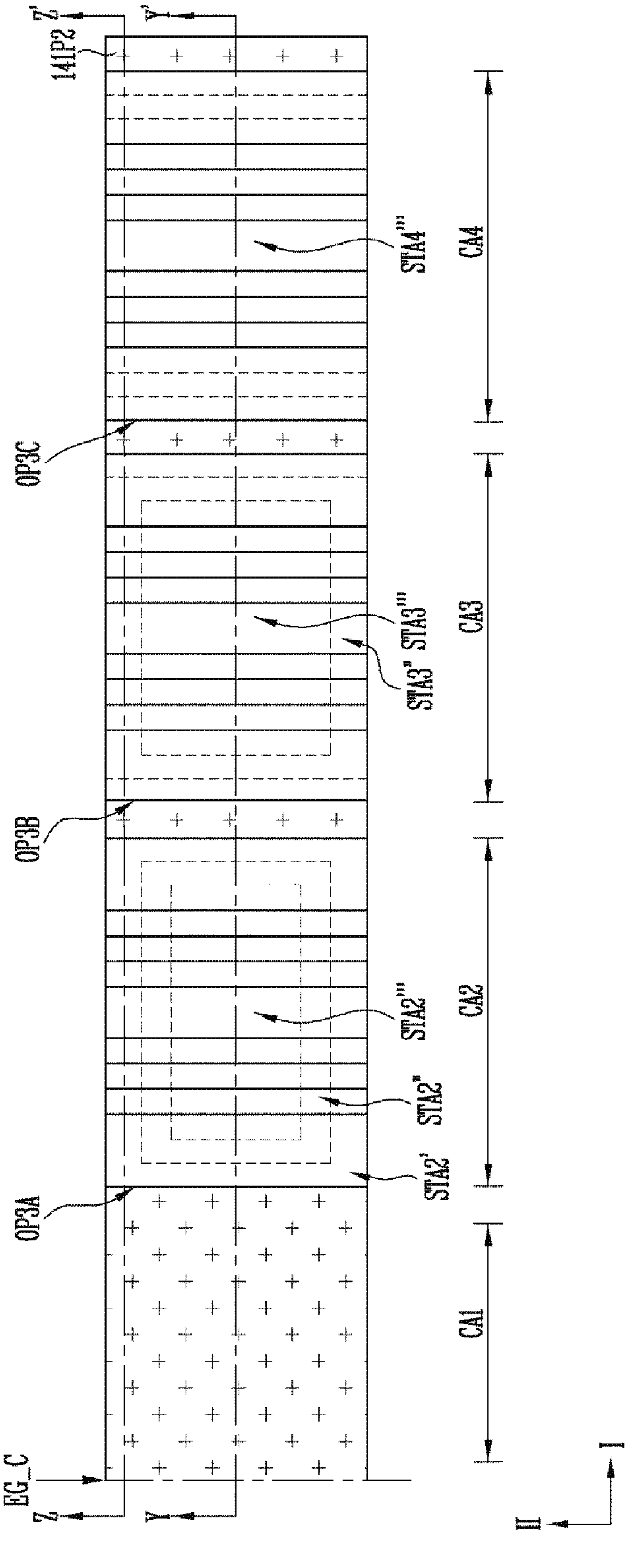
Figure 11B:
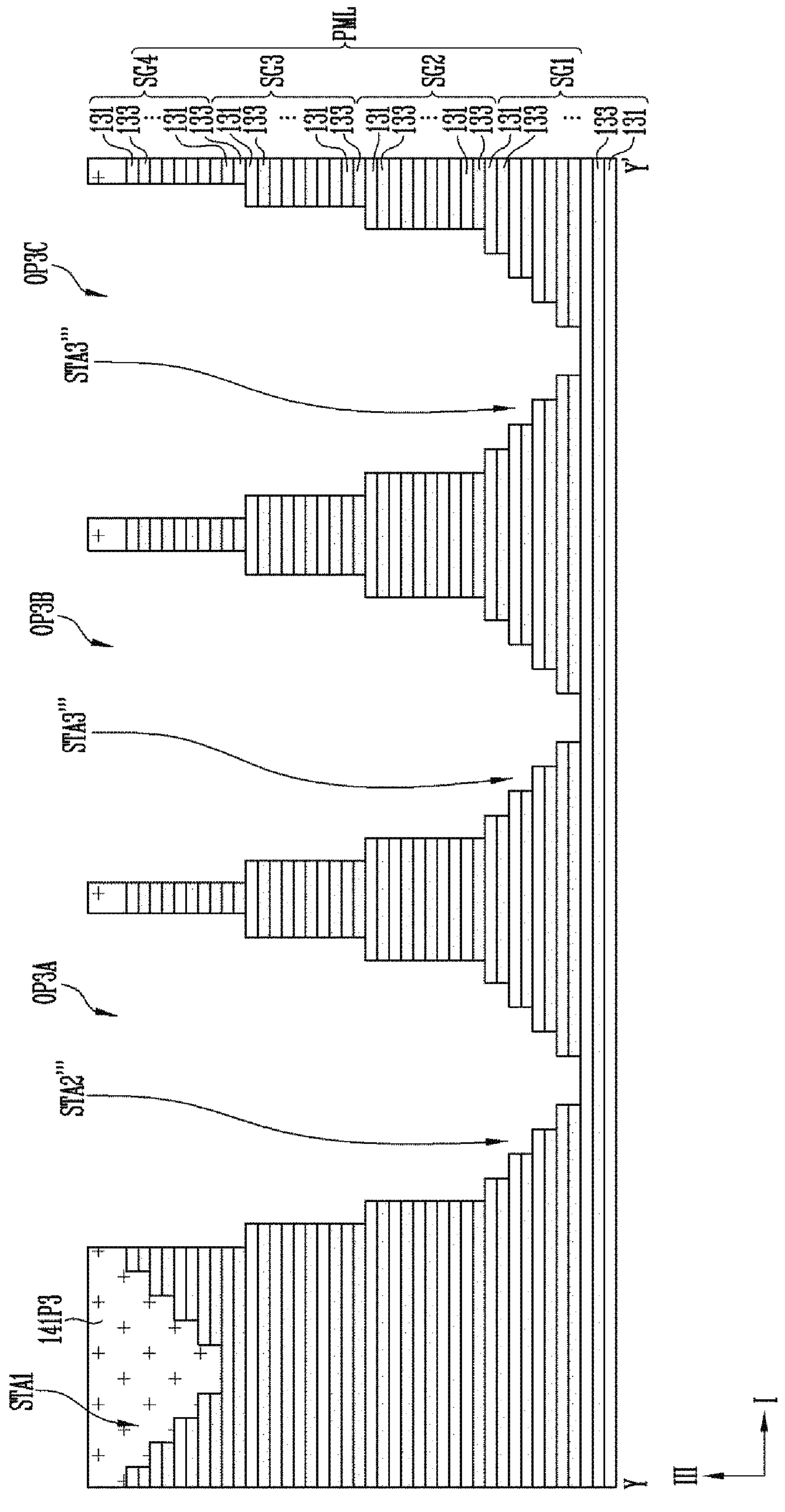
Figure 11C:
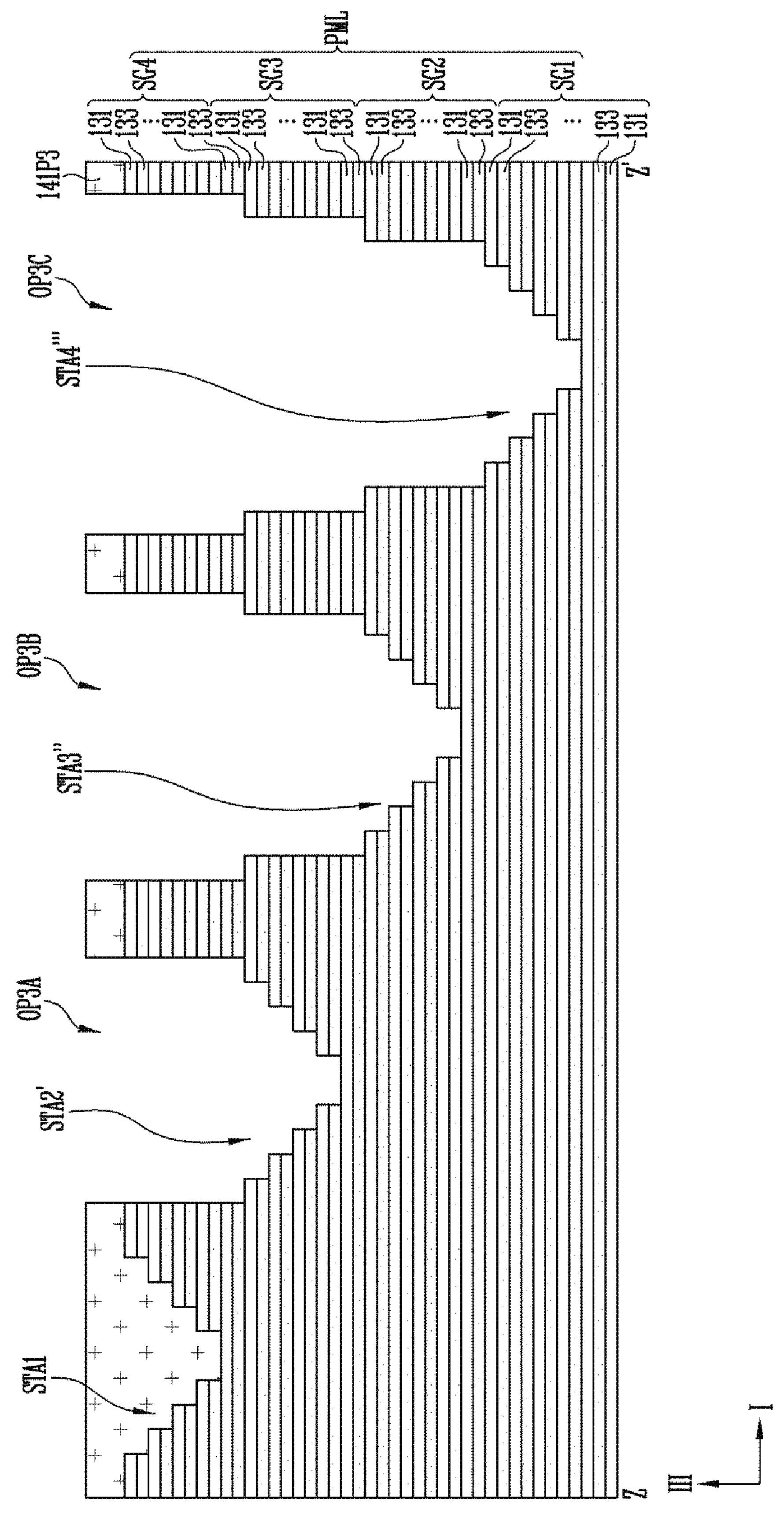

FIGS. 9A to 9C, 10A to 10C, and 11A to 11C illustrate the process of forming second-type stepped structures. FIGS. 9A, 10A, and 11A are plan views of the corresponding procedures. FIGS. 9B, 10B and 11B are cross-sectional views taken along the lines "Y-Y'" of FIGS. 9A, 10A, and 11A. FIGS. 9C, 10C and 11C are cross-sectional views taken along the lines "Z-Z'" of FIGS. 9A, 10A, and 11A.

In FIGS. 9A to 9C, a hole-type mask pattern 141P1 having first openings OP1A, OP1B, and OP1C is formed over the preliminary structure PML. The first openings OP1A, OP1B, and OP1C expose the second to $N^{th}$ stepped structures (e.g. STA2 to STA4 of FIGS. 8A and 8B). The hole-type mask pattern 141P1 is formed to block the first stepped structure STA1.

The first openings OP1A, OP1B, and OP1C may be aligned so that the centers thereof match each other in the first direction I. As such, the length of the first openings OP1A, OP1B, and OP1C in the second direction II may increase as a distance between the memory array area (P1 of FIG. 1) and the first opening increases. Using the length difference of the first openings OP1A, OP1B, and OP1C, the second-type stepped structures may be differently shaped on the second to $N^{th}$ contact areas (e.g. CA2 to CA4), which is described in detail below.

The second to $N^{th}$ stepped structures (e.g. STA2 to STA4 of FIGS. 8A and 8B) exposed through the first openings OP1A, OP1B, and OP1C are etched using the hole-type mask pattern 141P1 as an etching barrier. The etching depth in an etching process for forming second-type stepped structures using the hole-type mask pattern 141P1 as an etching barrier is greater than the etching depth in an etching process for forming first-type stepped structures (e.g. STA2 to STA4 of FIGS. 8A and 8B). In an embodiment, the etching depth in the etching process for forming the first-type stepped structures may be equal to the thickness of the pair of adjacent first and second material films. The etching depth in the etching process for forming the second-type stepped structures may be equal to the height of each of the first to $N^{th}$ stacked groups (e.g. SG1 to SG4).

When the second to $N^{th}$ stepped structures (e.g. STA2 to STA4 of FIGS. 8A and 8B) exposed through the first openings OP1A, OP1B, and OP1C are etched, the second to $N^{th}$ stepped structures (e.g. STA2 to STA4 of FIGS. 8A and 8B) are shifted to the inside of the $(N-1)^{th}$ stacked group (e.g. SG3) under the $N^{th}$ stacked group (e.g. SG4). Below, the second to $N^{th}$ stepped structures, which are shifted to the inside of the $(N-1)^{th}$ stacked group (e.g. SG3), are defined as the first etched portions STA2' to STA4' of the second to $N^{th}$ stepped structures. As such, some of the first to $(N-1)^{th}$ stepped structures (e.g. STA1 to STA3) blocked by the hole-type mask pattern 141P1 are not etched.

In FIGS. 10A to 10C, the hole-type mask pattern (141P1 of FIGS. 9A to 9C) is etched so as to form second openings OP2A, OP2B, OP2C wider than the first openings (OP1A, OP1B, OP1C of FIGS. 9A to 9C). In this manner, a first etched hole-type mask pattern 141P2 including the second openings OP2A, OP2B, and OP2C is formed.

The second openings OP2A, OP2B, and OP2C may expose the first etched portions (STA2' to STA4' of FIGS. 9A to 9C) of the second to $N^{th}$ stepped structures, and may also expose some of the upper surfaces of the $N^{th}$ stacked group (e.g. SG4) adjacent thereto and some of the non-etched second to $(N-1)^{th}$ stepped structures (e.g. STA2 to STA3). An etching process is performed using the first hole-type mask pattern (141P2) as an etching barrier, thereby etching the exposed portions of the $N^{th}$ stacked group (e.g. SG4) to the $N-2^{nd}$ stacked group (e.g. SG2). Thus, the first etched portions (e.g. STA2' to STA4') of the second to $N^{th}$ stepped structures are shifted to the inside of the $N-2^{nd}$ stacked group (e.g. SG2) under the $(N-1)^{th}$ stacked group (e.g. SG3). The second to $N^{th}$ stepped structures, which are shifted to the inside of the $N-2^{nd}$ stacked group (e.g. SG2), are defined as the second etched portions (e.g. STA2" to STA4") of the second to $N^{th}$ stepped structures. As such, some of the first to $N-2^{nd}$ stepped structures (e.g. STA1 to STA2) blocked by the first etched hole-type mask pattern 141P2 are not etched. Also, some of the upper surfaces of the $N^{th}$ stacked group (e.g. SG4) and some of the second to $(N-1)^{th}$ stepped structures (e.g. STA2 to STA3), exposed through the second openings OP2A, OP2B, and OP2C, are etched in the course of forming the second etched portions (e.g. STA2" to STA4") of the second to $N^{th}$ stepped structures. In this manner, the first etched portions (e.g. STA2' to STA3') of the second to $(N-1)^{th}$ stepped structures are formed around the second etched portions (e.g. STA2" to STA3") of the second to $(N-1)^{th}$ stepped structures.

In FIGS. 11A to 11C, until the $N^{th}$ stepped structure (e.g. STA4 of FIG. 8A) is shifted to the inside of the first stacked group SG1, widening the first openings of the hole-type mask pattern (e.g., 141P1 of FIGS. 9A to 9C) and etching the first and second material films 131 and 133 of the first to $N^{th}$ stacked groups (e.g. SG1 to SG4) are repeated [N−1] times.

The hole-type mask pattern (e.g., 141P1 of FIGS. 9A to 9C) is etched [N−1] times, thereby forming a [N−1] times-etched hole-type mask pattern (e.g. 141P3) including the $(N-1)^{th}$ openings (e.g. OP3A, OP3B, and OP3C). The $(N-1)^{th}$ openings (e.g. OP3A, OP3B, OP3C) are wider than the second openings (OP2A, OP2B, and OP2C of FIGS. 10A to 10C).

The first to $N^{th}$ stacked groups (e.g. SG1 to SG4) exposed through the $(N-1)^{th}$ openings (e.g. OP3A, OP3B, OP3C) are etched so that the $N^{th}$ stepped structure (e.g. STA4 of FIG. 8A) may be shifted to the inside of the first stacked group SG1. In this manner, the $(N-1)^{th}$ etched portions (e.g. STA3''', STA4''') are defined.

According to the processes described as above, while the etching process is repeated, the second-type stepped structures including multiple steps having height differences in not only the first direction I but also the second direction II may be formed. In embodiments of the present invention, the etching depth in the etching process for forming the first-type stepped structures is adjusted, thereby forming multiple steps having the first height difference in the first direction I. Also, the etching depth in the etching process for forming the second-type stepped structures is adjusted, thereby forming multiple steps having the second height difference greater than the first height difference in the second direction II.

In embodiments of the present invention, the length of the openings of the hole-type mask pattern is differently formed in the course of forming the second-type stepped structures, thus enabling the first-type stepped structures to be etched in different forms. In embodiments of the present invention, the first-type stepped structures arranged along the line "Z-Z'" may be disposed more deeply in the preliminary structure PML as a distance between the first-type stepped structure and the memory array area (e.g., P1 of FIG. 1) increases.

Although not shown, before the formation of the first-type stepped structures or after the formation of the second-type stepped structures, the channel film (CH of FIGS. 2A and 2B), which passes through the preliminary structure PML of the memory array area (P1 of FIG. 1), may be formed.

Figure 12A:
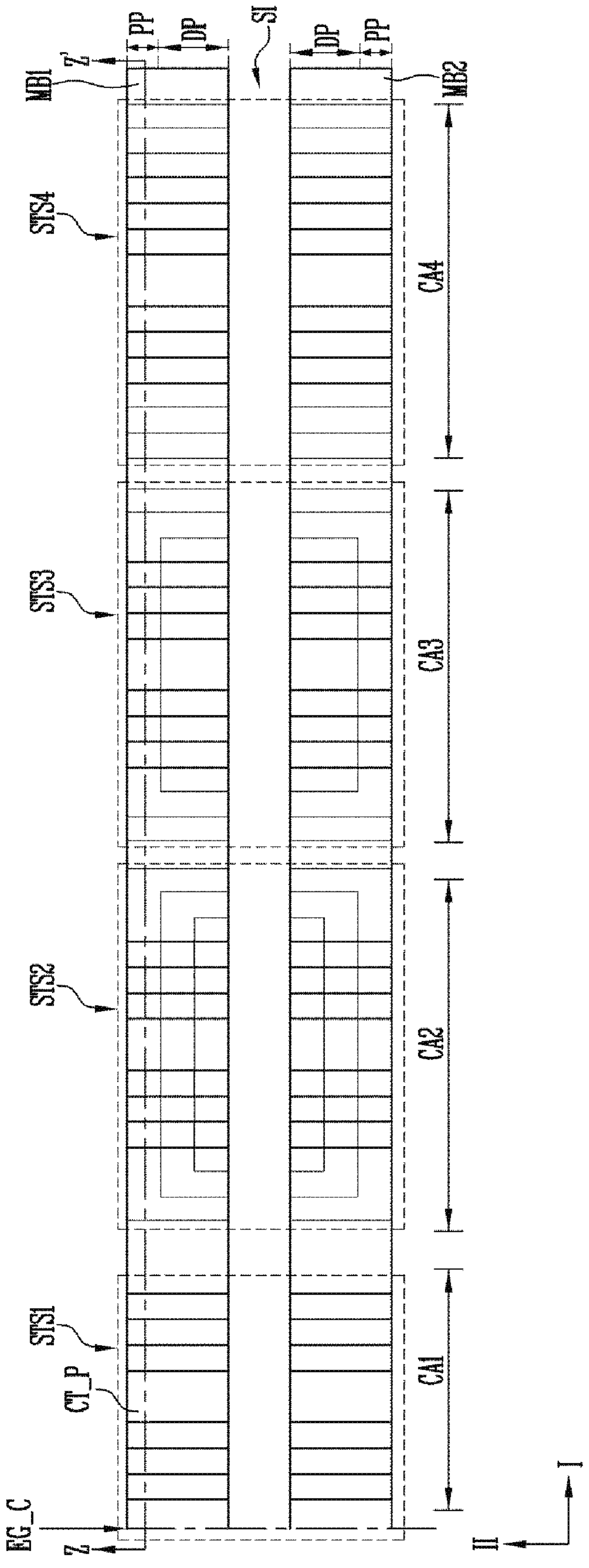
Figure 12B:
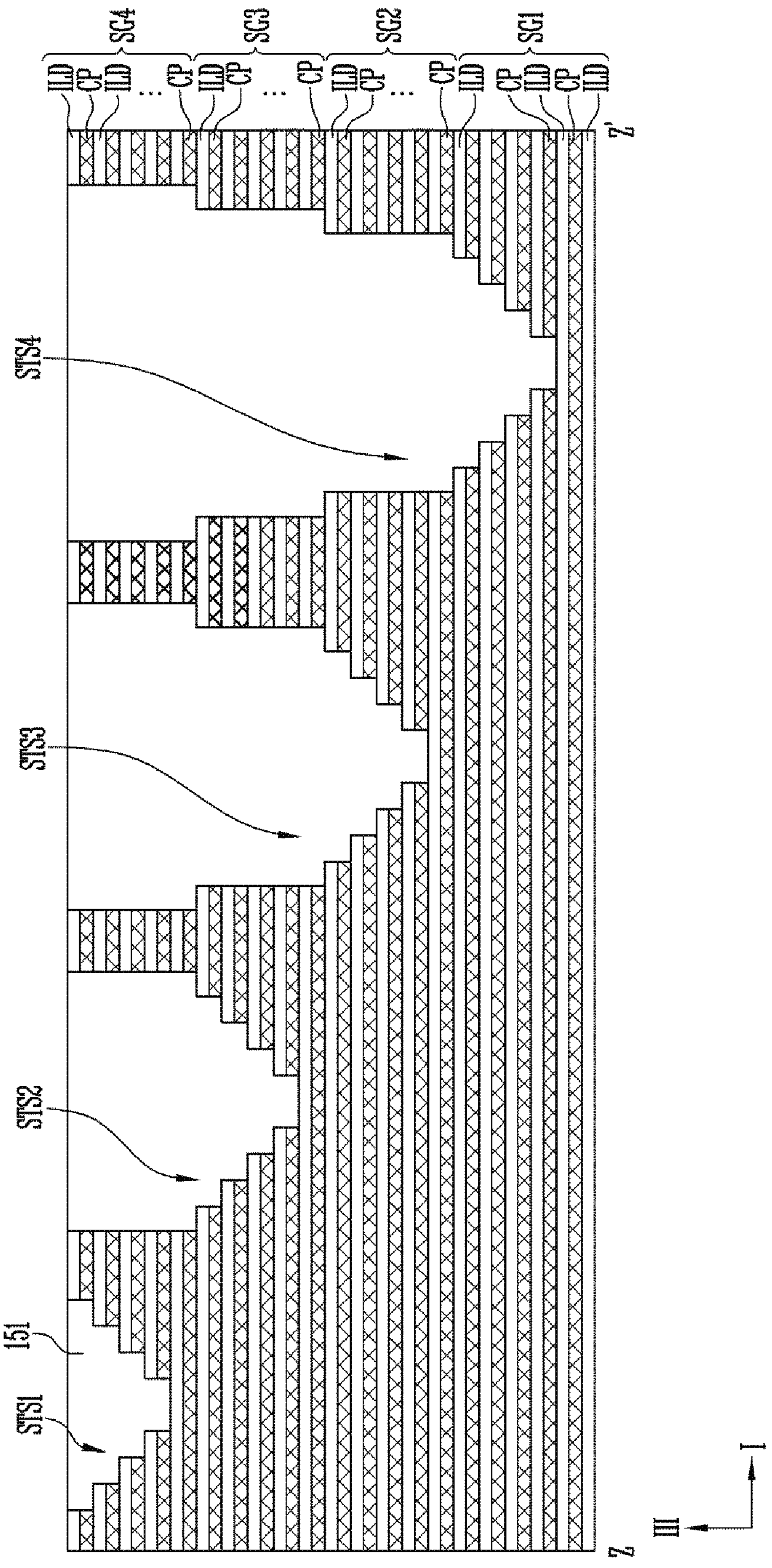

FIGS. 12A and 12B illustrate the process of forming concave portions and memory blocks. FIG. 12A is a plan view of the configuration formed over the contact area, and FIG. 12B is a cross-sectional view taken along the line "Z-Z'" of FIG. 12A.

In FIGS. 12A and 12B, after the hole-type mask pattern is removed, the first-type stepped structures and the second-type stepped structures may be filled with the planarization insulating film 151. Subsequently, the slit SI, by which the preliminary structure (PML of FIGS. 11A to 11C) is separated into first and second preliminary patterns, is formed.

When the first material films 131 are formed of an interlayer insulating film and the second material films 133 are formed of a conductive material for a conductive pattern, the interlayer insulating films ILD for the first material films 131 may be separated through the slit SI, and the conductive patterns CP for the second material films 133 may be separated.

When the first material films 131 are formed of an interlayer insulating film and the second material films 133 are formed of a sacrificial insulating film, the second material films 133 may be removed through the slit SI, and the portions formed by removing the second material films 133 may be filled with conductive patterns CP, which are third material films.

When the first material films 131 are formed of a sacrificial conductive material and the second material films 133 are formed of a conductive material for a conductive pattern, the first material films 131 may be removed through the slit SI, and the portions formed by removing the first material films 131 may be filled with the interlayer insulating films ILD, which are the third material films.

The first-type stepped structures and the second-type stepped structures, which face each other with the slit SI interposed therebetween, may be separated by the slit SI. In this manner, the first to $N^{th}$ concave portions (e.g. STS1 to STS4) having a symmetrical structure with respect to the slit SI may be formed. The first to $N^{th}$ concave portions (e.g. STS1 to STS4) manufactured by the processes shown in FIGS. 8A to 12B may be formed in structures described in FIGS. 4A to 5.

The slit SI may pass through the first to $N^{th}$ stacked groups (e.g. SG1 to SG4) including the interlayer insulating films ILD and the conductive patterns CP, which are alternately stacked, whereby the first to $N^{th}$ stacked groups (e.g. SG1 to SG4) may be separated into symmetrical first and second memory blocks MB1 and MB2.

Figure 13A:
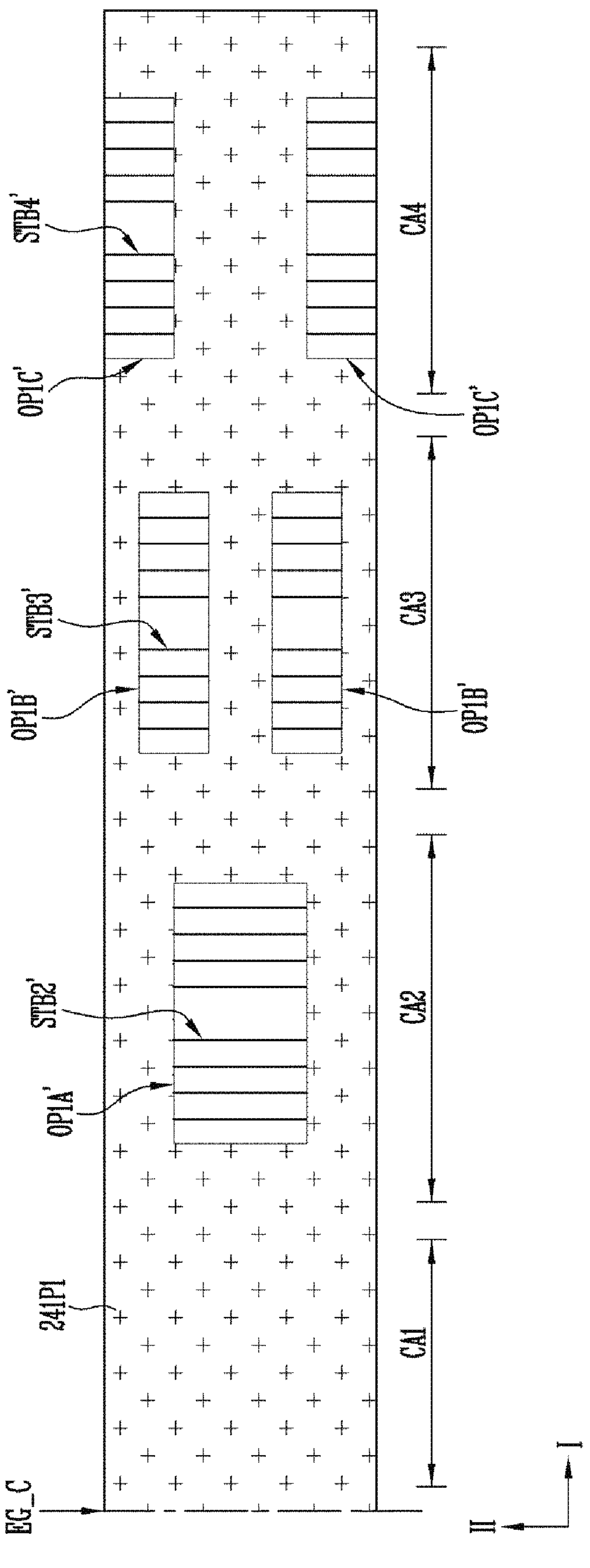
FIGS. 13A to 13D illustrate a process of forming the memory block of a semiconductor device according to an embodiment of the present invention.
Figure 13B:
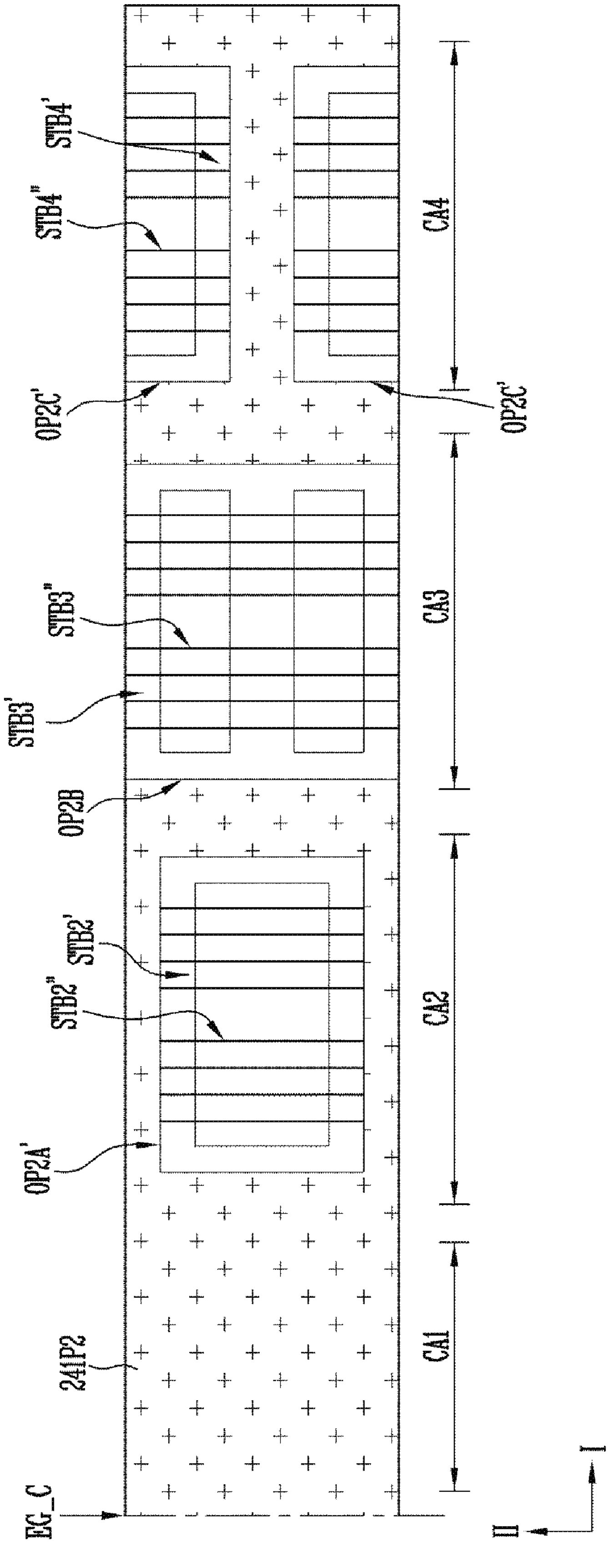
Figure 13C:
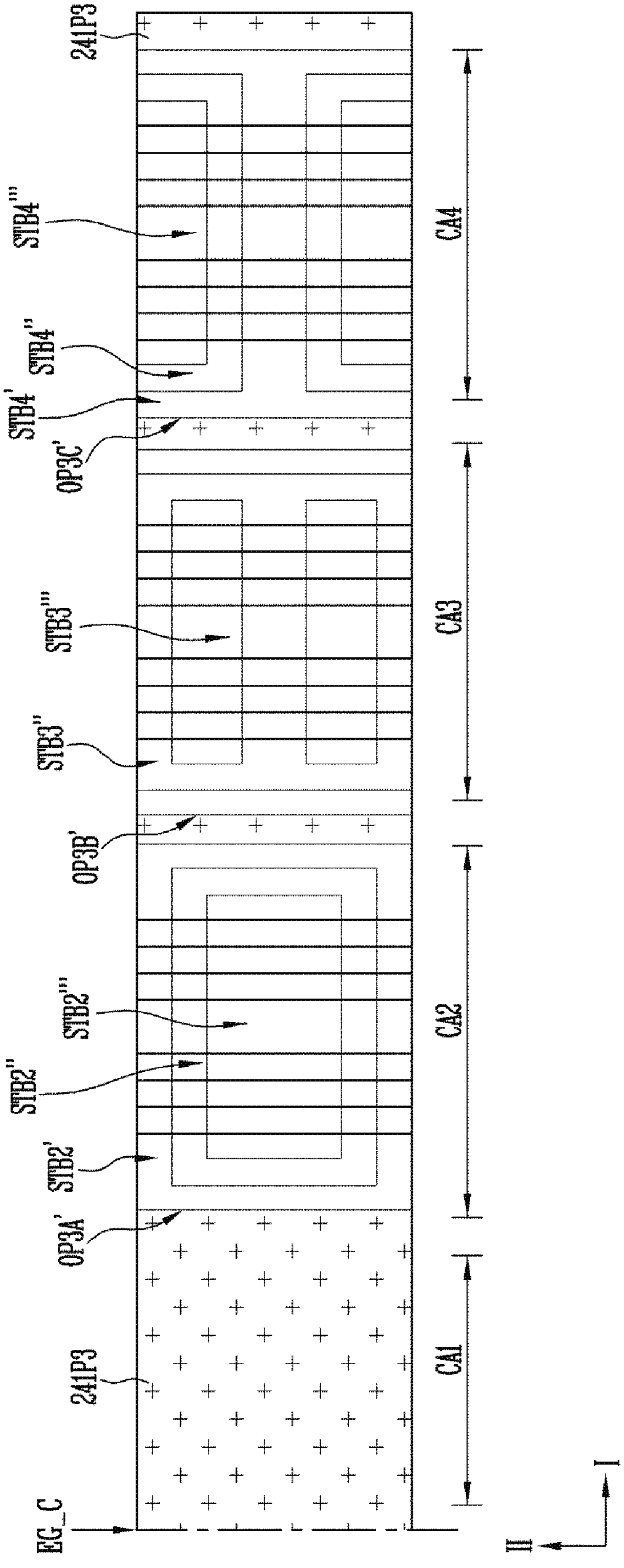

FIGS. 13A to 13D illustrate the process of forming the memory block of a semiconductor device according to an embodiment of the present invention. FIGS. 13A to 13C show another example of the hole-type mask pattern of FIGS. 9A to 11A, and FIG. 13D shows another example of the concave portions depending on another example of the hole-type mask pattern.

In FIG. 13A, a substrate including the first to $N^{th}$ pass transistor groups is formed, and then a preliminary structure including the first to $N^{th}$ stacked groups as shown in FIGS. 8A and 8B is formed thereon, and first-type stepped structures are formed in the $N^{th}$ stacked group. The first-type stepped structures include the first to $N^{th}$ stepped structures aligned in the first direction I as shown in FIGS. 8A and 8B. The first to $N^{th}$ stepped structures are disposed in the first to $N^{th}$ areas (e.g. CA1 to CA4) of the preliminary structure.

Subsequently, a hole-type mask pattern 241P1 including the first openings OP1A', OP1B', and OP1C' is formed over the preliminary structure. The first openings OP1A', OP1B', and OP1C' expose the second to $N^{th}$ stepped structures (e.g. STA2 to STA4 of FIGS. 8A and 8B). The hole-type mask pattern 241P1 is formed to block the first stepped structure (e.g. STA1 of FIGS. 8A and 8B).

The first openings may include first to $(N-1)^{st}$-type openings OP1A', OP1B', and OP1C'. The first-type opening OP1A' may expose the second stepped structure (e.g. STA2 of FIGS. 8A and 8B) adjacent to the first stepped structure (e.g. STA1 of FIGS. 8A and 8B). The second to $N-1^{st}$-type openings OP1B' and OP1C' are arranged in a symmetrical pair in a manner that increases the interval therebetween along with an increase in distance from the memory array area (P1 of FIG. 1) based on the central axis extending in the first direction I from the center of the first-type opening OP1A'. Through the second to $N-1^{st}$-type openings OP1B' and OP1C', the third to $N^{th}$ stepped structures (e.g. STA3 to STA4 of FIGS. 8A and 8B) are exposed.

Using the hole-type mask pattern 241P1 as an etching barrier, the second to $N^{th}$ stepped structures (e.g. STA2 to STA4 of FIGS. 8A and 8B) exposed through the first to $N-1^{st}$-type openings OP1A', OP1B', and OP1C' are etched. As such, this etching depth is greater than the etching depth in the etching process for forming the first-type stepped structures. When the etching process is performed in this way, the second to $N^{th}$ stepped structures (e.g. STA2 to STA4 of FIGS. 8A and 8B) are shifted to the inside of the $(N-1)^{th}$ stacked group (e.g. SG3 of FIG. 8B) under the $N^{th}$ stacked group (e.g. SG4 of FIG. 8B). Below, the second to $N^{th}$ stepped structures, which are shifted to the inside of the $(N-1)^{th}$ stacked group (e.g. SG3), are defined as the first etched portions STB2' to STB4' of the second to $N^{th}$ stepped structures. As such, some of the first to $(N-1)^{th}$ stepped structures blocked by the hole-type mask pattern 241P1 are not etched.

In FIG. 13B, the hole-type mask pattern (e.g., 241P1 of FIG. 13A) is etched so as to form second openings OP2A', OP2B', and OP2C' wider than the first openings (e.g., OP1A', OP1B', and OP1C' of FIG. 13A). In this manner, a first etched hole-type mask pattern 241P2 including the second openings OP2A', OP2B', and OP2C' is formed.

The second openings OP2A', OP2B', and OP2C' may expose the first etched portions (STB2' to STB4' of FIG. 13A) of the second to $N^{th}$ stepped structures and may also expose some of the upper surfaces of the $N^{th}$ stacked group (e.g. SG4 of FIG. 8B) adjacent thereto and some of the non-etched second to $N^{th}$ stepped structures (e.g. STA2 to STA4 of FIGS. 8A and 8B). In the etching process using the first etched hole-type mask pattern 241P2 as the etching barrier, the exposed portions of the $N^{th}$ stacked group (e.g. SG4 of FIG. 8B) to the $N-2^{nd}$ stacked group (e.g. SG2 of FIG. 8B) are etched. In this manner, the first etched portions (e.g. STB2' to STB4') of the second to $N^{th}$ stepped structures are shifted to the inside of the $N-2^{nd}$ stacked group (e.g. SG2 of FIG. 8B) under the $(N-1)^{th}$ stacked group (e.g. SG3 of FIG. 8B). The second to $N^{th}$ stepped structures, which are shifted to the inside of the $N-2^{nd}$ stacked group (e.g. SG2 of FIG. 8B), are defined as the second etched portions (e.g. STB2" to STB4") of the second to $N^{th}$ stepped structures. As such, some of the first to $N-2^{nd}$ stepped structures (e.g. STA1 to STA2 of FIGS. 8A and 8B) blocked by the first etched hole-type mask pattern 241P2 are not etched. As illustrated in FIGS. 10A to 10C, the first etched portions (e.g. STB2' to STB4') of the second to $N^{th}$ stepped structures are formed around the second etched portions (e.g. STB2" to STB4") of the second to $N^{th}$ stepped structures in the course of forming the second etched portions (e.g. STB2" to STB4") of the second to $N^{th}$ stepped structures.

In FIG. 13C, until the $N^{th}$ stepped structure (e.g. STA4 of FIG. 8A) is shifted to the inside of the first stacked group (SG1 of FIG. 8B), widening the first openings of the hole-type mask pattern (241P1 of FIG. 13A) and etching the first and second material films (131, 133 of FIG. 8B) of the first to $N^{th}$ stacked groups (e.g. SG1 to SG4 of FIG. 8B) are repeated [N−1] times.

The hole-type mask pattern (241P1 of FIG. 13A) is etched [N−1] times, thereby forming a [N−1] times-etched hole-type mask pattern (e.g. 241P3) including $(N-1)^{th}$ openings (e.g. OP3A', OP3B', OP3C'). The $(N-1)^{th}$ openings (e.g. OP3A', OP3B', OP3C') are wider than the second openings (OP2A', OP2B', OP2C' of FIG. 13B).

The first to $N^{th}$ stacked groups (e.g. SG1 to SG4 of FIG. 8B) exposed through the $(N-1)^{th}$ openings (e.g. OP3A', OP3B', OP3C') are etched so that the $N^{th}$ stepped structure (e.g. STA4 of FIG. 8A) may be shifted to the inside of the first stacked group (SG1 of FIG. 8B). In this manner, the $(N-1)^{th}$ etched portions (e.g. STB2'", STB3'", STB4'") are defined.

As the etching process is repeated, the second-type stepped structures including multiple steps having height differences in not only the first direction I but also the second direction II may be formed. In embodiments of the present invention, the etching depth in the etching process for forming the first-type stepped structures is adjusted, thus forming multiple steps having the first height difference in the first direction I. Also, the etching depth in the etching process for forming the second-type stepped structures is adjusted, thus forming multiple steps having the second height difference greater than the first height difference in the second direction II.

In embodiments of the present invention, in the course of forming the second-type stepped structures, the openings of the hole-type mask pattern are arranged symmetrically along the first direction. As such, the openings are disposed in a manner that increases the intervals therebetween along with an increase in distance from the memory array area. In this manner, in embodiments of the present invention, the first-type stepped structures may be etched in different forms. Particularly, the positions of the first-type stepped structures in the preliminary structure PML may become lower as the distance between the memory array area (P1 of FIG. 1) and the first-type stepped structure increases.

In embodiments of the present invention, in the course of forming the second-type stepped structures, the $N^{th}$ stepped structures are patterned to have height differences in the first direction I and the second direction II.

Figure 13D:
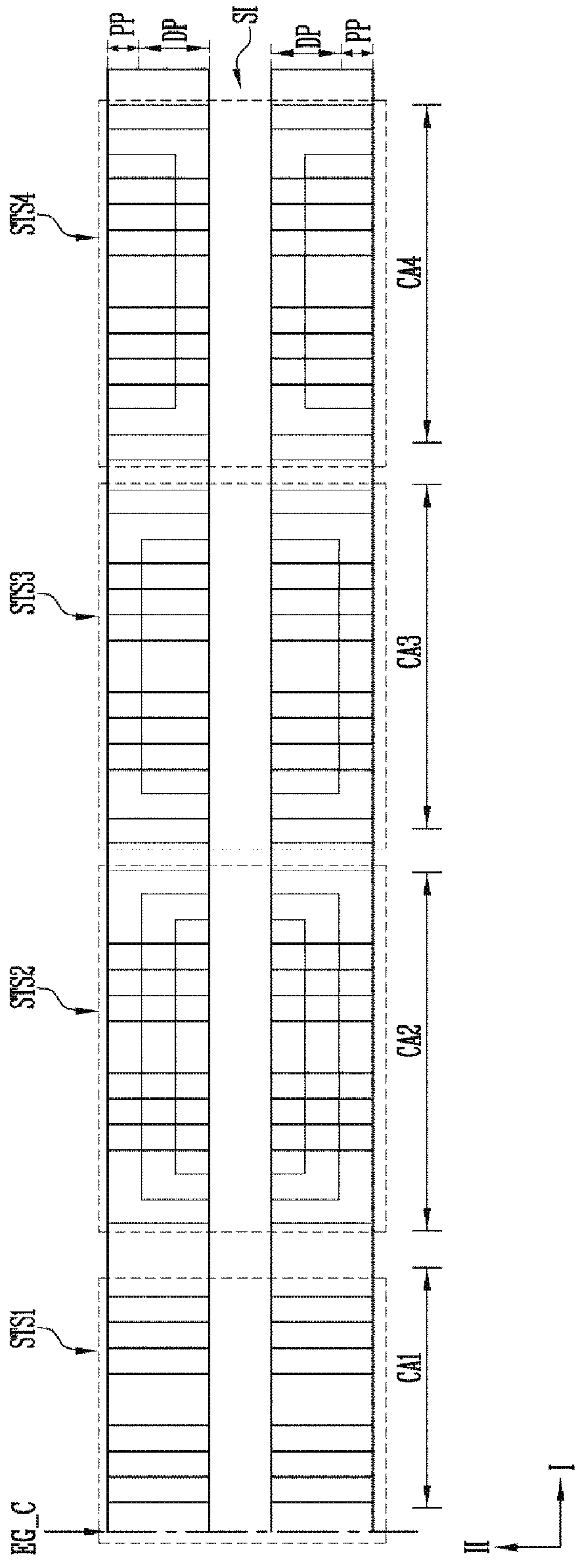

In FIG. 13D, the same processes as shown in FIGS. 12A and 12B are performed. In this manner, the first-type stepped structures and the second-type stepped structures may be separated by the slit SI. As a result, the first to $N^{th}$ concave portions (e.g. STS1 to STS4), which are symmetrical with respect to the slit SI, may be formed. The second to $N^{th}$ concave portions (e.g. STS2 to STS4) shown in FIG. 13D have height differences in the first direction I and the second direction II.

Figure 14A:
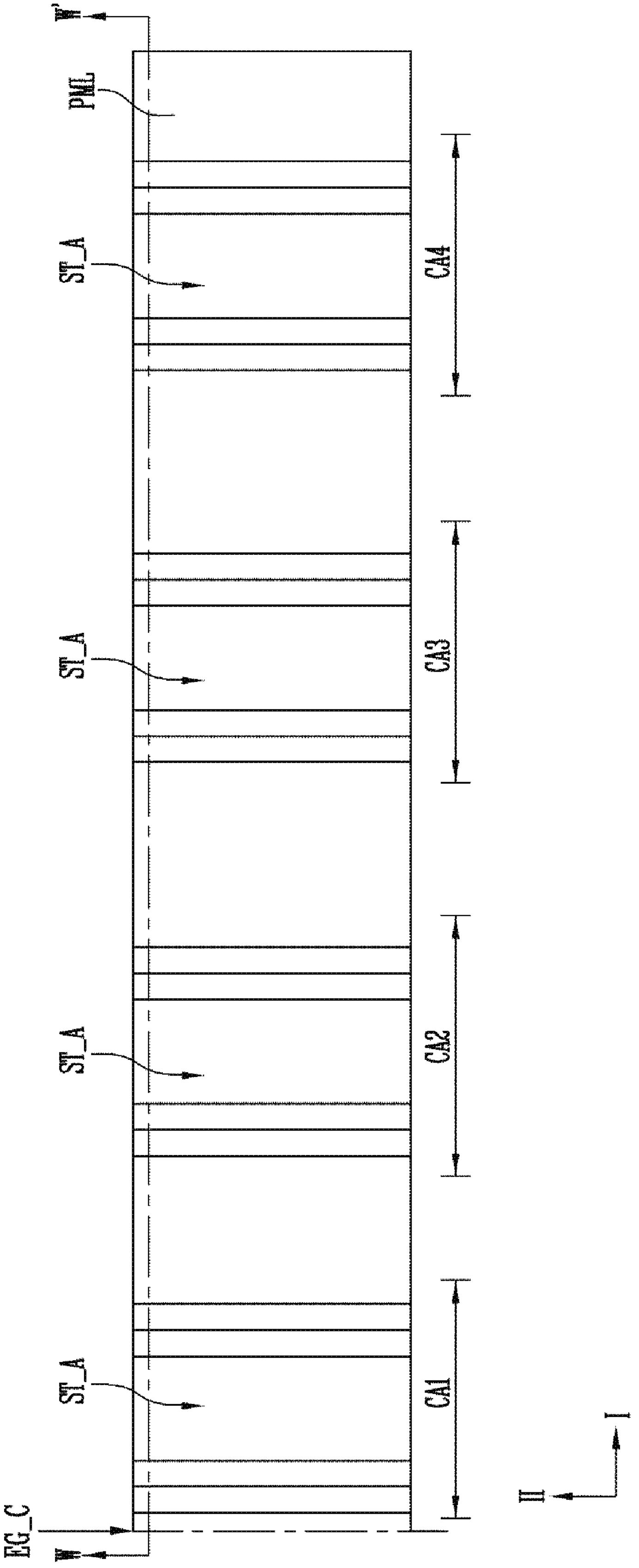
FIG. 14A to FIG. 16 illustrate a process of forming the memory block of a semiconductor device according to an embodiment of the present invention.
Figure 14B:
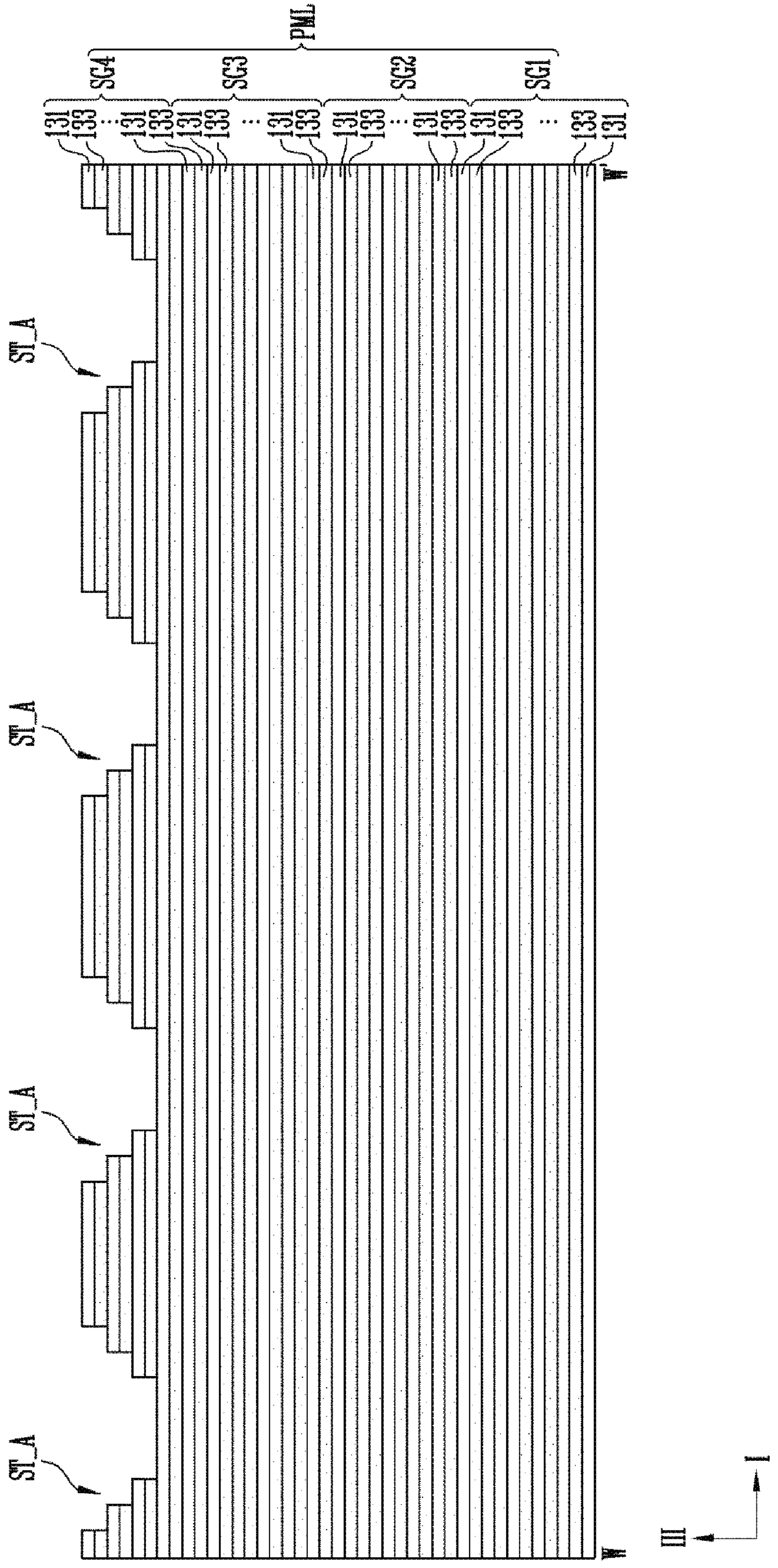
Figure 15A:
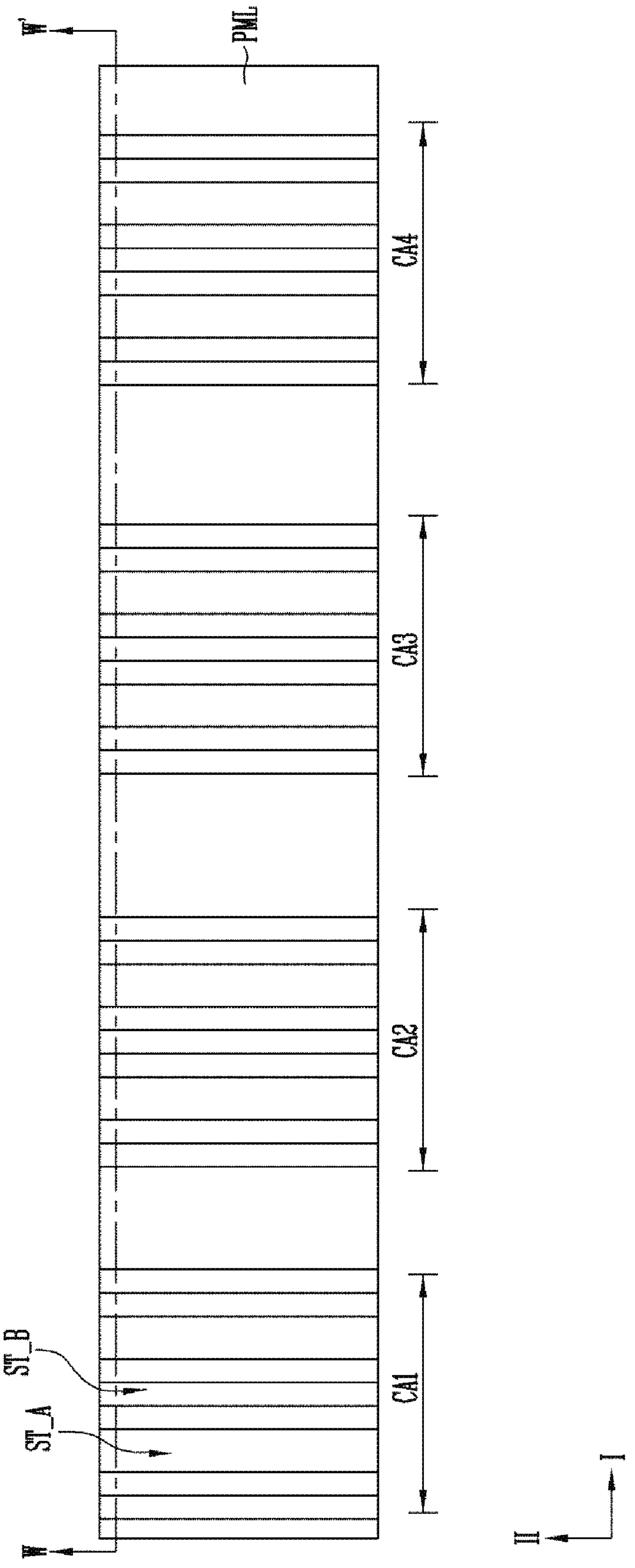
Figure 15B:
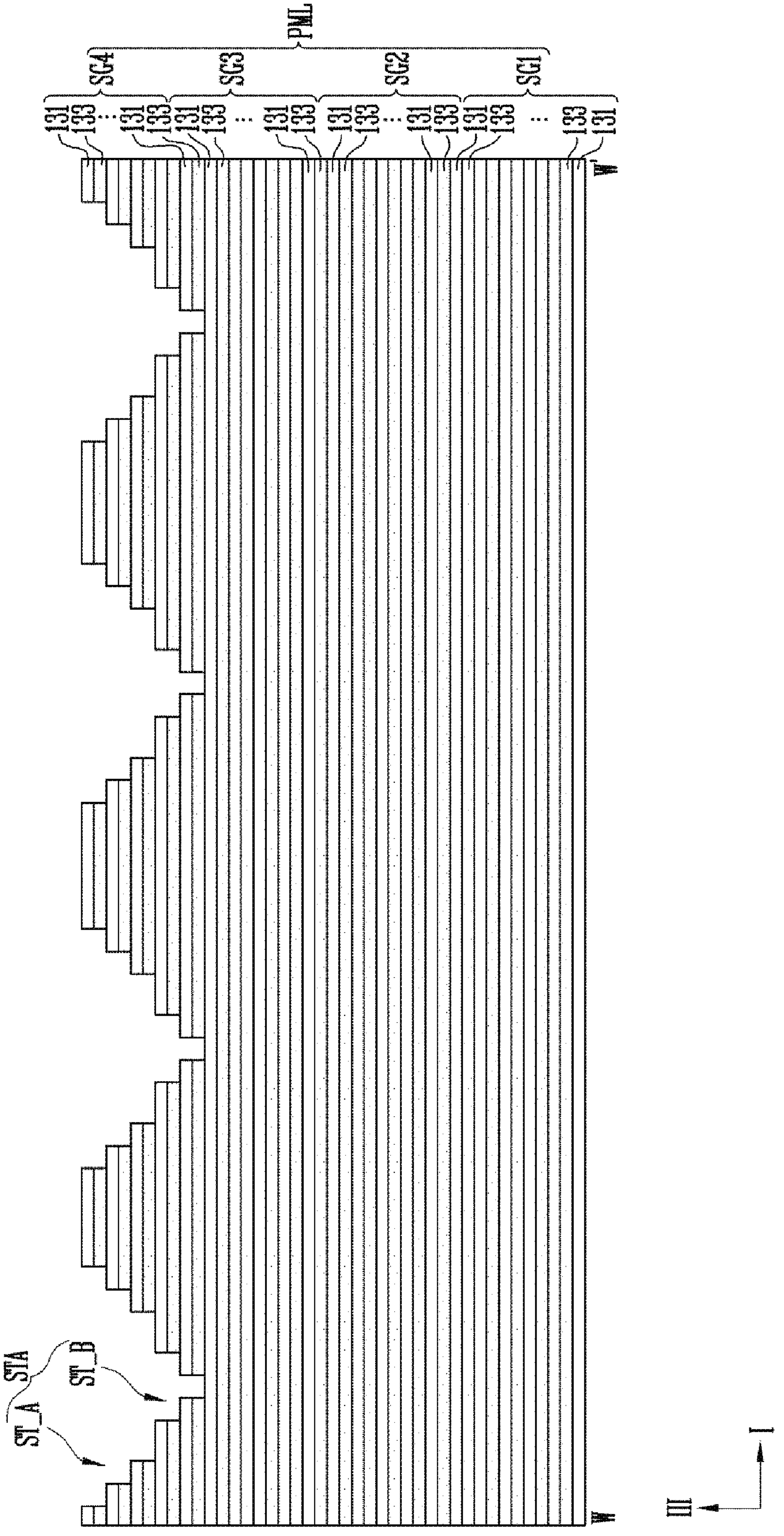
Figure 16:
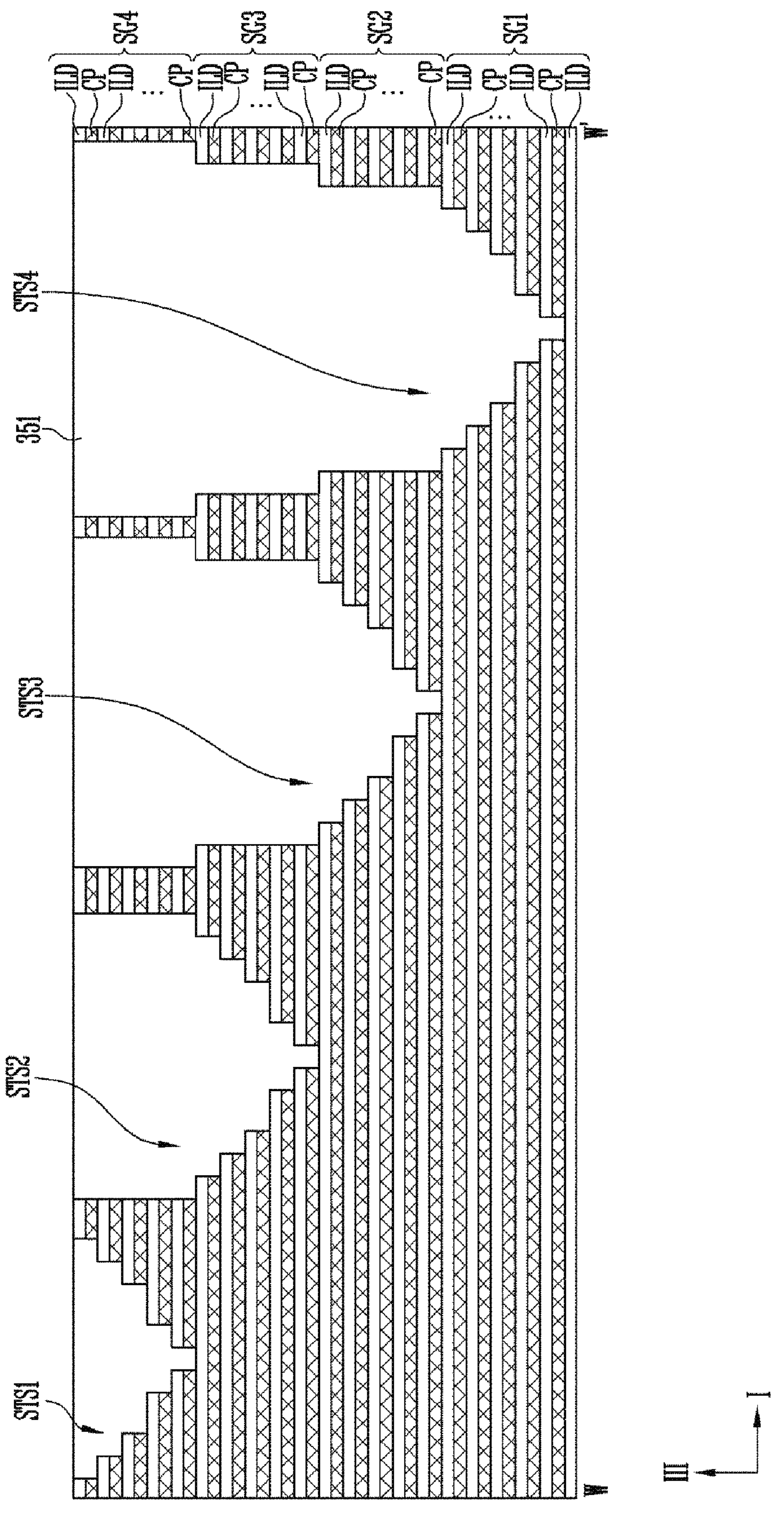

FIGS. 14A to 16 illustrate the process of forming the memory block of a semiconductor device according to an embodiment of the present invention. FIGS. 14A, 14B, 15A, and 15B illustrate another example of the formation of the first-type stepped structures, and FIG. 16 illustrates subsequent processes after the formation of the first-type stepped structures. FIGS. 14A and 15A are plan views illustrating a configuration formed over the contact area, and FIGS. 14B, 15B, and 16 are cross-sectional views taken along the lines "W-W'" of the top plan views.

In FIGS. 14A and 14B, a preliminary structure PML having the first to $N^{th}$ stacked groups (e.g. SG1 to SG4) is formed over a substrate including the pass transistors (e.g. TR of FIG. 3). The preliminary structure PML includes the first to $N^{th}$ stacked groups (e.g. SG1 to SG4) having the same structure as those illustrated in FIGS. 8A and 8B. The contact area of the preliminary structure PML may include the first to $N^{th}$ areas (e.g. CA1 to CA4) in which the concave portions will be disposed.

The first to $N^{th}$ stacked groups (e.g. SG1 to SG4) include first material films 131 and second material films 133, which are alternately stacked. The properties of the first material films 131 and the second material films 133 are the same as those described in FIGS. 8A and 8B.

Thereafter, a first mask pattern (not shown) is formed over the $N^{th}$ stacked group (e.g. SG4). Subsequently, the first mask pattern may include first trenches, which extend along the second direction II and are spaced apart from each other in the first direction I. In an etching process using the first mask pattern as an etching barrier, the first material films 131 and the second material films 133, which are formed of a upper portion of the $N^{th}$ stacked group (e.g. SG4), are etched. In the etching process using the first mask pattern as the etching barrier, a first etching set, which includes a pair of first and second material films disposed at the uppermost positions among the first material films 131 and the second material films 133, is etched. By the etching process, the width of the first trenches is increased, and the size of the first mask pattern is decreased. Ultimately, the size of the area exposed by the first trenches is increased. In this manner, some of the remaining area of the first etching set and the pair of first and second material films disposed adjacent to the first etching set under the first etching set are exposed as a second etching set. Subsequently, an etching process using the first mask pattern, which has decreased in size, as an etching barrier, is carried out, whereby the exposed portions of the first etching set and the second etching set are etched.

As described above, increasing the width of the first trenches and etching the first and second material films 131 and 133 of the $N^{th}$ stacked group (e.g. SG4) are repeated, whereby A-type stepped structures ST_A may be formed in the upper portion of the $N^{th}$ stacked group (e.g. SG4). After the formation of the A-type stepped structures ST_A, the first mask pattern may be removed.

In FIGS. 15A and 15B, B-type stepped structures ST_B, which are coupled to the A-type stepped structures ST_A and are formed deeper than the A-type stepped structures ST_A, are provided. The A-type stepped structures ST_A include upper steps of the first-type stepped structures, and the B-type stepped structures ST_B include lower steps of the first-type stepped structures.

In order to form the B-type stepped structures ST_B, a second mask pattern (not shown) including second trenches narrower than the first trenches may cover the A-type stepped structures ST_A. The second trenches may extend along the second direction II, may be spaced apart from each other in the first direction I, and may be disposed to expose the centers of the A-type stepped structures ST_A. Subsequently, until the B-type stepped structures ST_B are formed, etching the first and second material films 131 and 133 of the $N^{th}$ stacked group (e.g. SG4) exposed through the second trenches and increasing the width of the second trenches are repeated. Thereafter, the second mask pattern may be removed.

Through the processes described in FIGS. 14A to 15B, the first-type stepped structures STA including the A-type stepped structures ST_A and the B-type stepped structures ST_B may be formed.

In FIG. 16, second-type stepped structures and a slit are formed using the processes described in FIGS. 9A to 12B or in FIGS. 13A to 13D. In this manner, the first to $N^{th}$ concave portions (e.g. STS1 to STS4) are formed. The first to $N^{th}$ concave portions (e.g. STS1 to STS4) may be filled with a planarization insulating film 351.

Through the slit, the first material films or the second material films may be replaced with third material films, or the first material films or the second material films may be separated to form the first and second memory blocks including the interlayer insulating films ILD and the conductive patterns CP, which are alternately stacked.

FIGS. 17A to 19 illustrate the process of forming the memory block of a semiconductor device according to an embodiment of the present invention.

Figure 17A:
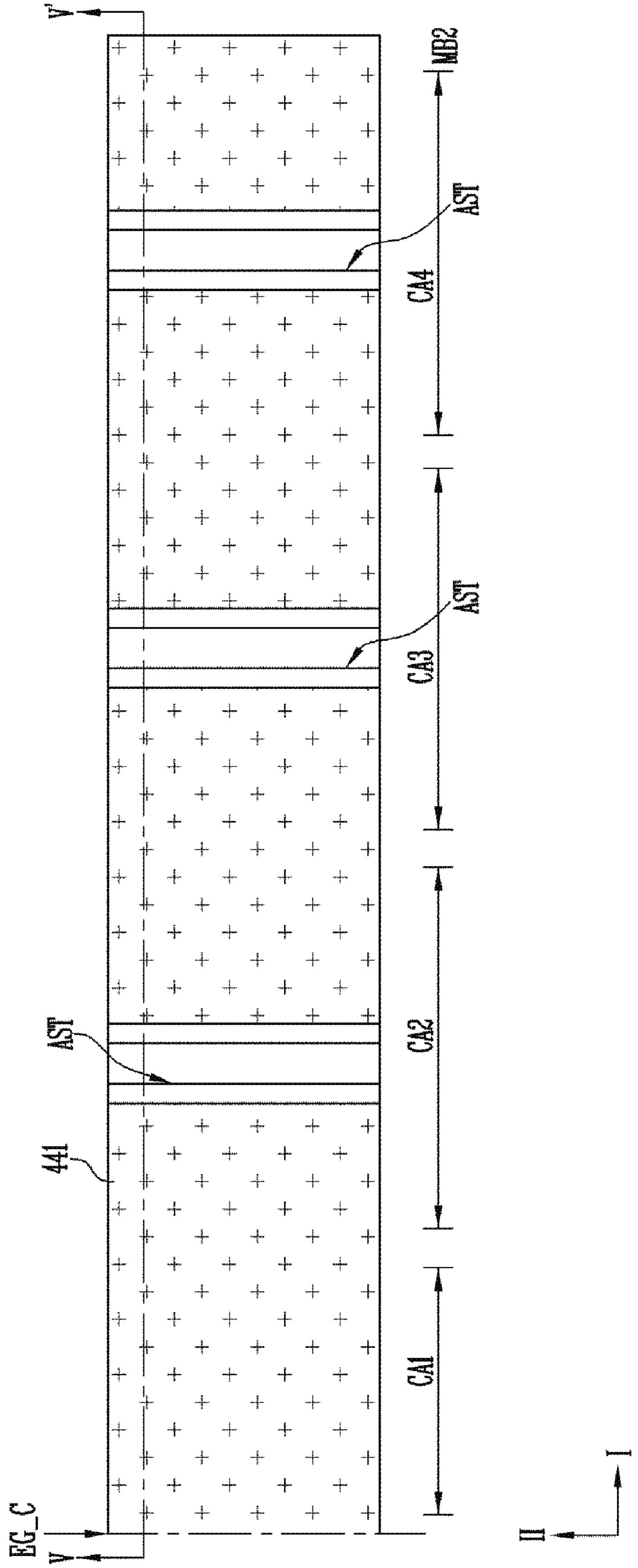
FIG. 17A to FIG. 19 illustrate a process of forming the memory block of a semiconductor device according to an embodiment of the present invention.
Figure 17B:
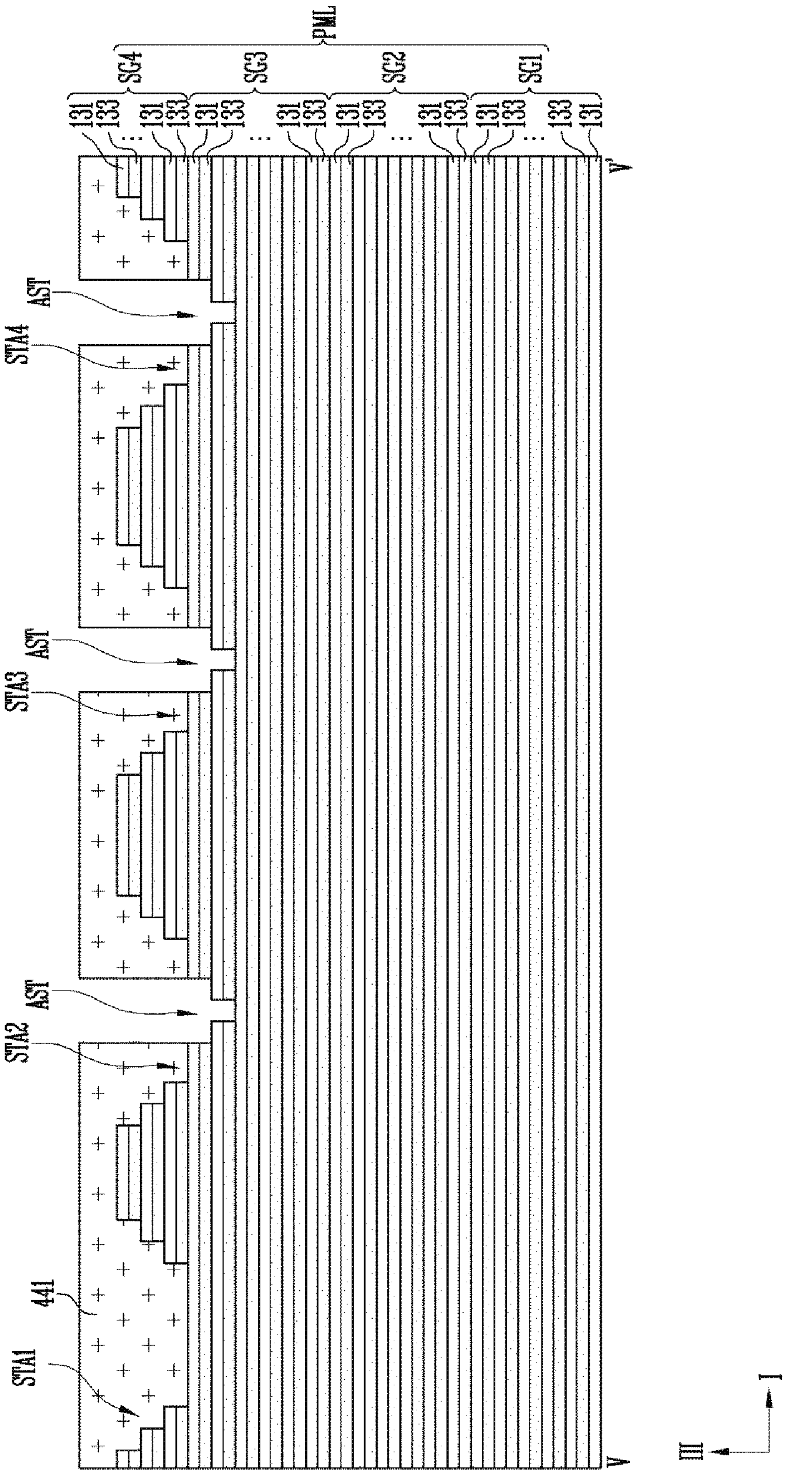

FIGS. 17A and 17B illustrate the process of forming additional stepped structures coupled to the first-type stepped structures. FIG. 17A is a plan view illustrating the configuration formed over the contact area, and FIG. 17B is a cross-sectional view taken along the line "V-V'" of FIG. 17A.

In FIGS. 17A and 17B, a preliminary structure PML including the first to $N^{th}$ stacked groups (e.g. SG1 to SG4) is formed over a substrate including the pass transistors (e.g. TR of FIG. 3). The preliminary structure PML includes the first to $N^{th}$ stacked groups (e.g. SG1 to SG4). The contact area of the preliminary structure PML may include the first to $N^{th}$ areas (e.g. CA1 to CA4) where the concave portions will be disposed.

The first to $N^{th}$ stacked groups (e.g. SG1 to SG4) include first material films 131 and second material films 133, which are alternately stacked. The properties of the first material films 131 and the second material films 133 are the same as those described in FIGS. 8A and 8B. The numbers of layers of first material films 131 and second material films 133 of each of the first to $(N-1)^{th}$ stacked groups SG1 to SG3 are large compared to the $N^{th}$ stacked group SG4.

Thereafter, a first mask pattern (not shown) is formed over the $N^{th}$ stacked group (e.g. SG4). Subsequently, the first mask pattern may include first trenches, which extend along the second direction II and are spaced apart from each other in the first direction I. An etching process is performed using the first mask pattern as an etching barrier, whereby N first-type stepped structures (e.g. STA1 to STA4) may be formed in the $N^{th}$ stacked group (e.g. SG4). After formation of the first-type stepped structures STA1 to STA4, the first mask pattern may be removed.

Subsequently, additional stepped structures AST, which are coupled to the first-type stepped structures STA1 to STA4 and are formed deeper than the first-type stepped structures STA1 to STA4, are formed inside the $(N-1)^{th}$ stacked group SG3.

In order to form the additional stepped structures AST, a second mask pattern 441 including second trenches narrower than the first trenches may be formed to cover the first-type stepped structures STA1 to STA4. The second trenches may extend along the second direction II and may be spaced apart from each other in the first direction I. The second mask pattern 441 is formed to cover the first first-type stepped structure STA1 adjacent to the memory array area among the first-type stepped structures STA1 to STA4. The second trenches are disposed at the centers of the second to $N^{th}$ first-type stepped structures STA2 to STA4. In this manner, the second trenches may expose the $(N-1)^{th}$ stacked group SG3 through the second to $N^{th}$ first-type stepped structures STA2 to STA4.

Subsequently, until the additional stepped structures AST are formed, etching the first and second material films 131, 133 of the $(N-1)^{th}$ stacked group (e.g. SG3) exposed through the second trenches and increasing the width of the second trenches are repeated. The second mask pattern 441 may be removed after the formation of the additional stepped structures AST.

Figure 18:
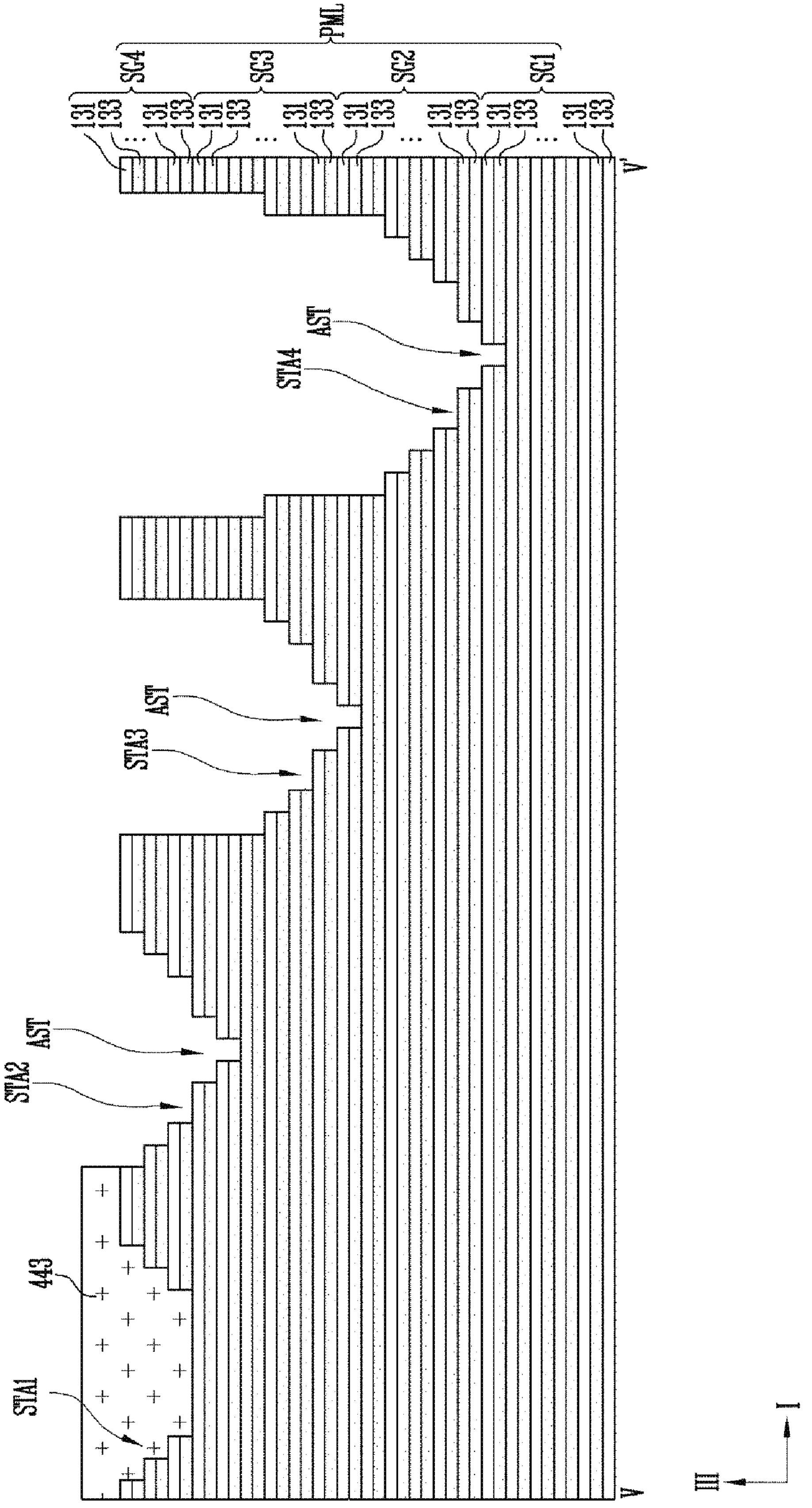

FIG. 18 illustrates another example of the etching process using the hole-type mask pattern.

In FIG. 18, a hole-type mask pattern 443 is formed over the stacked groups SG1 to SG4 where the first-type stepped structures STA1 to STA4 and the additional stepped structures AST are formed. The hole-type mask pattern 443 is formed to block the first first-type stepped structure STA1. In the initial formation of the hole-type mask pattern 443, the hole-type mask pattern 443 may include the first openings as shown in FIG. 9A or 13A.

Until the $N^{th}$ first-type stepped structure STA4 of the first-type stepped structures STA1 to STA4 is shifted to the inside of the $(N-1)^{th}$ stacked group SG3, etching the first and second material films 131 and 133 using the hole-type mask pattern 443 as an etching barrier and increasing the width of the first openings are repeated. Such an etching process enables the steps of the stepped structure to be formed at the same height as the height of the first and second material films 131 and 133 of the $(N-1)^{th}$ stacked group SG3.

Through the above etching process, the additional stepped structure AST coupled to the $N^{th}$ first-type stepped structure STA4 may be shifted to the inside of the top of the $N^{th}$ stacked group SG4.

Figure 19:
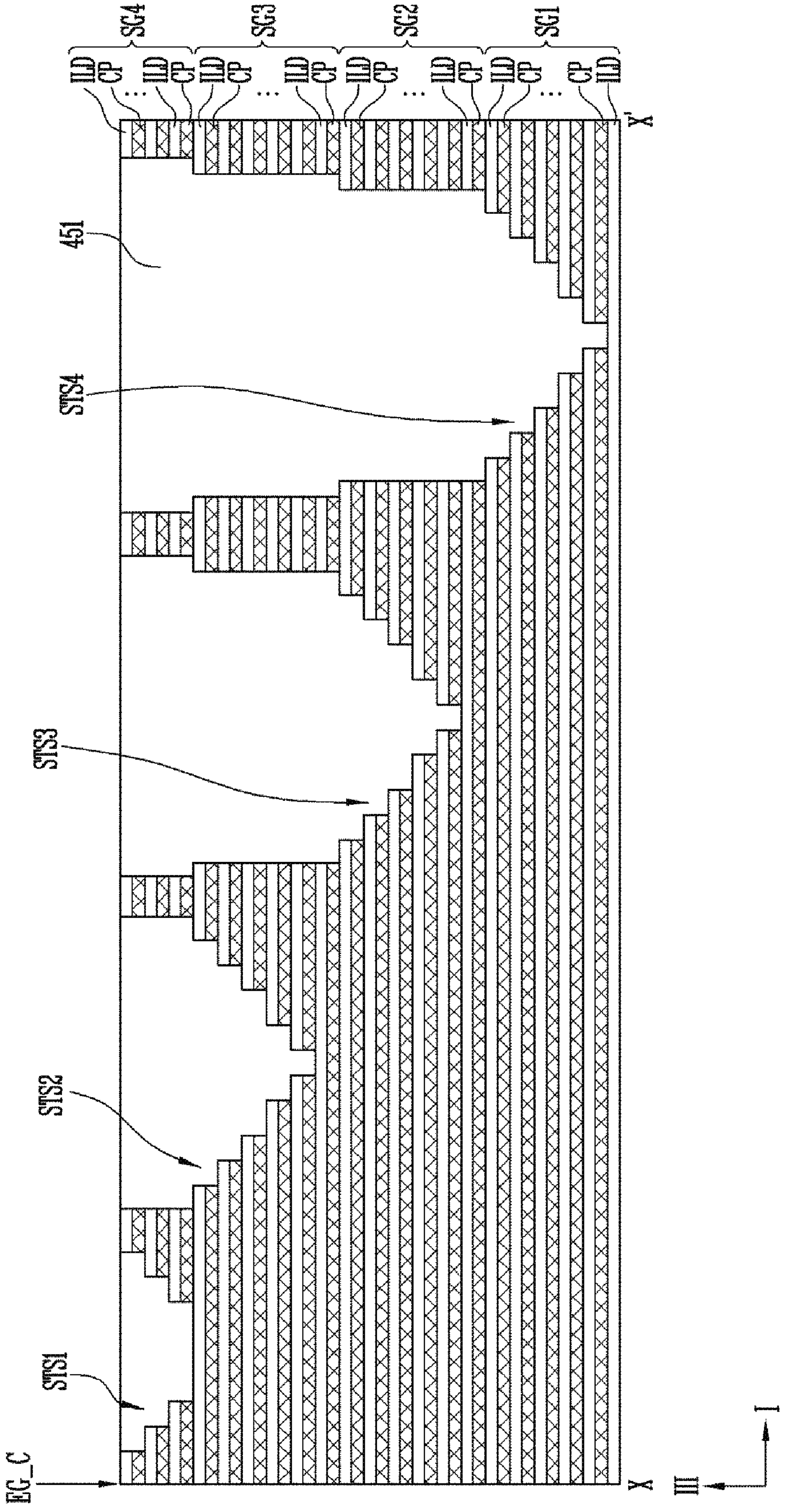

In FIG. 19, the openings of the hole-type mask pattern shown in FIG. 18 are widened, and then an etching process is performed using, as an etching barrier, the hole-type mask pattern including the widened openings, whereby the first and second material layers 131, 133 are etched. As such, the etching process may be performed until the $N^{th}$ first-type stepped structure (STA4 of FIG. 18) is shifted to the inside of the $N^{th}$ stacked group SG4. Also, the etching depth is the same as the height difference between the height of one of the first-type stepped structures STA 1 to STA4 and the height of the additional stepped structure AST.

Subsequently, second-type stepped structures and a slit are formed using the processes as described in 12A and 12B. In this manner, the first to $N^{th}$ concave portions (e.g. STS1 to STS4) are formed. The first to $N^{th}$ concave portions (e.g. STS1 to STS4) may be filled with a planarization insulating film 451.

Through the slit, the first material films or the second material films may be replaced with the third material films, or the first material films or the second material films may be separated, thus forming the first and second memory blocks including the interlayer insulating films ILD and the conductive patterns CP, which are alternately stacked.

The first to $N^{th}$ concave portions STS1 to STS4 formed through the processes depicted in FIGS. 17A to 19 may be configured as shown in FIG. 7.

In an embodiment, the concave portions having stepped sidewalls are formed within the stacked groups including the conductive patterns stacked at predetermined intervals, thereby providing the area for connecting the conductive patterns to the contact plugs.

In an embodiment, the stepped structures are formed within the stacked groups using the hole-type mask pattern as an etching barrier. In this manner, a process of forming the memory block in accordance with an embodiment facilitates the linear exposure of the conductive patterns, which are disposed at different heights through the stepped structures.

Figure 20:
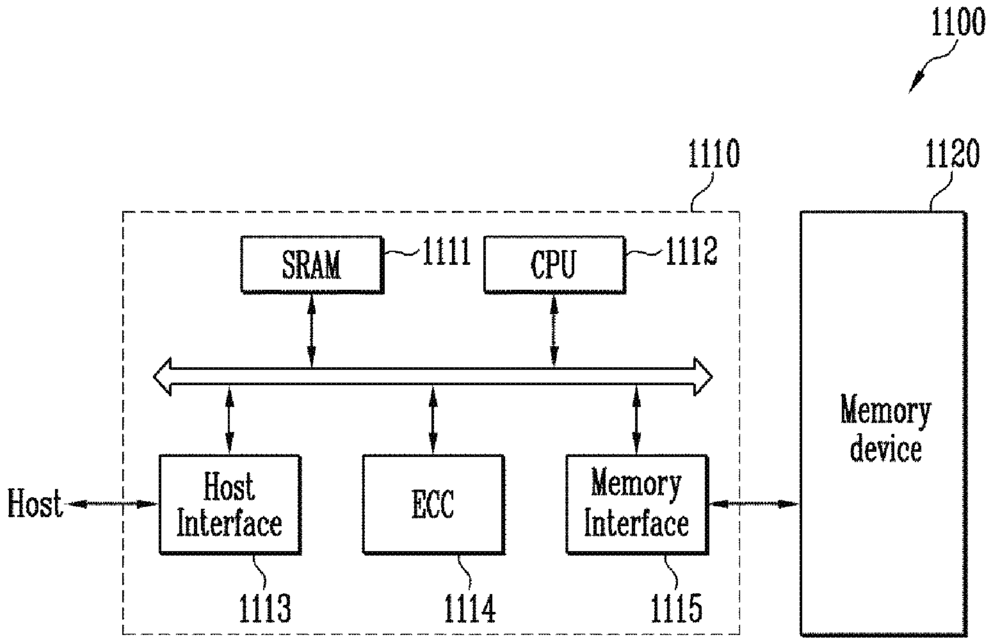
FIG. 20 illustrates a memory system according to an embodiment of the present invention.

FIG. 20 illustrates a memory system according to an embodiment of the present invention.

In FIG. 20, the memory system 1100 according to an embodiment of the present invention includes a memory device 1120 and a memory controller 1110.

The memory device 1120 has the configuration described in the embodiments of FIGS. 1 to 19. Also, the memory device 1120 may be a multi-chip package comprising a plurality of flash memory chips.

The memory controller 1110 may control the memory device 1120, and may include an SRAM 1111, a CPU 1112, a host interface 1113, an ECC 1114, and a memory interface 1115. The SRAM 1111 is used as an operation memory of the CPU 1112, and the CPU 1112 executes the general control operation for data exchange of the memory controller 1110, and the host interface 1113 includes a data exchange protocol of the host coupled to the memory system 1100. Also, the ECC 1114 functions to detect and correct the error contained in data read from the memory device 1120, and the memory interface 1115 provides an interface between the memory device 1120 and other components. In addition, the memory controller 1110 may further include ROM for storing code data to interface with the host.

The memory system 1100 may be a memory card or a solid state disk (SSD) configured such that the memory device 1120 and the controller 1110 are coupled to each other. In an example, when the memory system 1100 is SSD, the memory controller 1110 may communicate with a device (e.g. host) coupled to the controller 1110 through any one of various interface protocols, such as USB, MMC, PCI-E, SATA, PATA, SCSI, ESDI, IDE and the like.

Figure 21:
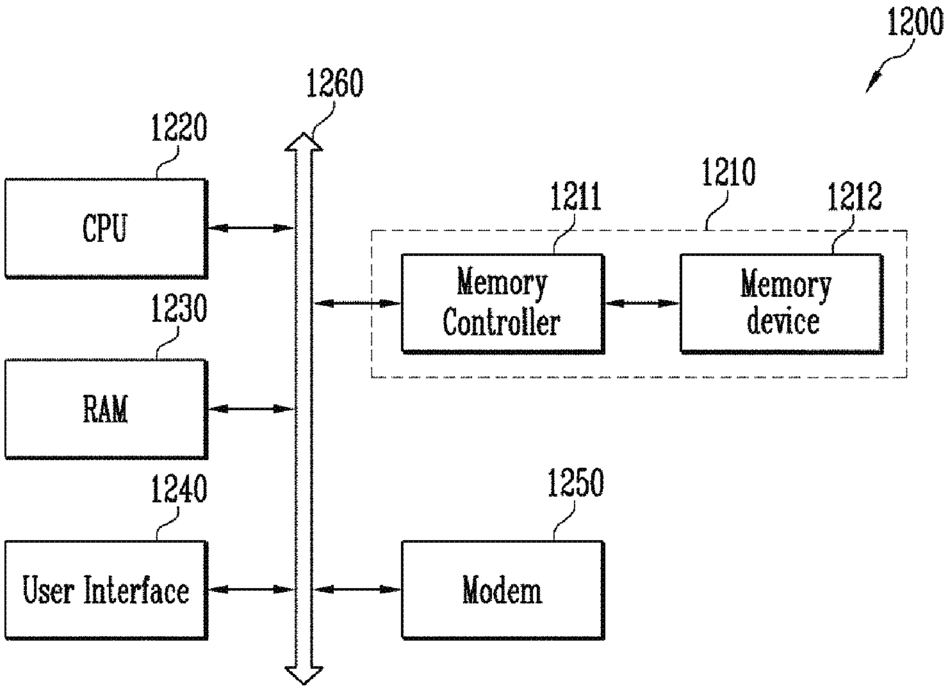
FIG. 21 illustrates a computing system according to an embodiment of the present invention.

FIG. 21 illustrates a computing system according to an embodiment of the present invention.

In FIG. 21, the computing system 1200 according to an embodiment of the present invention may include a CPU 1220, an RAM 1230, a user interface 1240, a MODEM 1250, and a memory system 1210, which are electrically connected to a system bus 1260. When the computing system 1200 is a mobile device, a battery may be further provided to supply operating voltage to the computing system 1200. Also, the computing system may further include application chipsets, a camera image processor (CIS), a mobile D-RAM, etc.

The memory system 1210 may include a memory device 1212 and a memory controller 1211 as described referring to FIG. 20.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor device, comprising:

N stacked groups (where N is a natural number greater than or equal to two) vertically stacked on top of each other, the N stacked groups each including interlayer insulating films and conductive patterns alternately stacked; and N concave portions respectively formed in the N stacked groups, the N concave portions each having stepped sidewalls and aligned in a first direction, wherein bottoms of the N concave portions are located at different levels, wherein an uppermost $N^{th}$ stacked group among the N stacked groups remains between the N concave portions.

2. The semiconductor device according to claim 1, wherein regions of the N stacked groups disposed between the N concave portions have a same height.

3. The semiconductor device according to claim 1, wherein the stepped sidewalls of each of the N concave portions face each other in the first direction and are symmetrical.

4. The semiconductor device according to claim 1, wherein at least one of the N concave portions has first steps having a first height difference in the first direction, and second steps having a second height difference greater than the first height difference in a second direction perpendicular to the first direction.

5. A semiconductor device, comprising:

N stacked groups (where N is a natural number greater than or equal to two) vertically stacked on top of each other, the N stacked groups each including interlayer insulating films and conductive patterns alternately stacked; and N concave portions respectively formed in the N stacked groups, the N concave portions each having stepped sidewalls and aligned in a first direction, wherein second to $N^{th}$ concave portions sequentially aligned in the first direction, among the N concave portions have V-shaped grooves located at a same level, respectively, and wherein the V-shaped grooves extend in a second direction perpendicular to the first direction so that the V-shaped grooves have different widths in the second direction.

6. The semiconductor device according to claim 5, wherein each of the V-shaped grooves has a surface in which first steps are formed along a V-shape.

7. The semiconductor device according to claim 5, wherein each of the second to $(N-1)^{th}$ concave portions has second steps formed in the second direction.

8. The semiconductor device according to claim 7, wherein the second steps are defined by one of the V-shaped grooves and at least one upper V-shaped groove located at higher level than the V-shaped grooves.

9. The semiconductor device according to claim 5, wherein each of the second to $(N-1)^{th}$ concave portions has first steps having a first height difference in the first direction, and second steps having a second height difference greater than the first height difference in the second direction.

10. A semiconductor device, comprising:

N stacked groups (where N is a natural number greater than or equal to two) vertically stacked on top of each other, the N stacked groups each including interlayer insulating films and conductive patterns alternately stacked; and N concave portions formed in the interlayer insulating films and the conductive patterns, the N concave portions each having stepped sidewalls and aligned in a first direction, wherein regions of the N stacked groups disposed between the N concave portions have a same height, and wherein bottoms of the N concave portions are located at different levels.

* * * * *